(12) United States Patent
Pronina et al.

(10) Patent No.: US 12,030,437 B2
(45) Date of Patent: Jul. 9, 2024

(54) POWER AND BATTERY SYSTEMS FOR A DIGITAL LICENSE PLATE

(71) Applicant: ReviverMx, Inc., Foster City, CA (US)

(72) Inventors: Olga Pronina, Foster City, CA (US); Todd Christopher Mason, Danville, CA (US); Andrey Shigapov, Foster City, CA (US)

(73) Assignee: ReviverMX Inc., Granite Bay, CA (US)

( * ) Notice: Subject to any disclaimer, the term of this patent is extended or adjusted under 35 U.S.C. 154(b) by 974 days.

(21) Appl. No.: 16/943,974

(22) Filed: Jul. 30, 2020

(65) Prior Publication Data

US 2022/0032860 A1 Feb. 3, 2022

(51) Int. Cl.
| | |
|---|---|
| *B60R 13/10* | (2006.01) |
| *B60L 58/16* | (2019.01) |
| *G01R 31/374* | (2019.01) |
| *G01R 31/392* | (2019.01) |
| *H04W 52/02* | (2009.01) |

(52) U.S. Cl.
CPC .............. *B60R 13/10* (2013.01); *B60L 58/16* (2019.02); *G01R 31/374* (2019.01); *G01R 31/392* (2019.01); *H04W 52/0248* (2013.01); *H04W 52/0254* (2013.01)

(58) Field of Classification Search
None
See application file for complete search history.

(56) References Cited

U.S. PATENT DOCUMENTS

| | | | |
|---|---|---|---|
| 2008/0007222 A1 | 1/2008 | Nance et al. | |
| 2017/0131362 A1* | 5/2017 | Wickham | G01R 31/396 |
| 2018/0186309 A1 | 7/2018 | Batten et al. | |
| 2018/0186311 A1* | 7/2018 | Mason | B60R 21/01 |
| 2018/0226697 A1* | 8/2018 | Edwards | H01M 16/00 |
| 2018/0246552 A1 | 8/2018 | Thompson et al. | |
| 2019/0058248 A1* | 2/2019 | Kopelman | H01Q 1/24 |
| 2019/0184842 A1* | 6/2019 | Waters | B60L 53/12 |
| 2022/0047178 A1* | 2/2022 | Rogers | A61B 5/0022 |

* cited by examiner

*Primary Examiner* — Raul J Rios Russo
*Assistant Examiner* — Carl F. R. Tchatchouang
(74) *Attorney, Agent, or Firm* — Innovent Law P.C; Karima Gulick

(57) ABSTRACT

A power system for a digital license plate includes a sensor, storage memory, and a battery status monitor operable only during operation of the digital license plate. The battery status monitor includes an analog to digital converter (ADC) connected to a battery to provide status data to a processor in the digital license plate, with status data being stored in the storage memory. A determination of battery lifetime being made at least in part using the status data and input from the sensor. In one embodiment status data can include external temperature.

17 Claims, 15 Drawing Sheets

601

| State | CPU | Modem | Screen Info | Front Light | GPS | OBD-II |
|---|---|---|---|---|---|---|
| 602 | On | Connected | Changeable | On | On | On |
| 604 | Off | Off | Frozen on last image | Off | Off | Off |
| 606 | On, but low power | Connected | Changeable | On | Off | Off |
| 608 | Suspended /low power | Low power/listening for SMS | Frozen on last image | Off | Off | Off |

# POWER AND BATTERY SYSTEMS FOR A DIGITAL LICENSE PLATE

TECHNICAL FIELD

The present disclosure generally relates to a digital license plate. More particularly, a digital license plate having various power and battery systems to improve performance and increase expected battery life is disclosed.

BACKGROUND

Upon registering a vehicle, the owner of a vehicle is typically issued a license plate that displays the vehicle identification and registration information. Such license plates printed or stamped. Electrical power is not needed to view license plates in daytime, and low power lightbulbs or LEDs are all that is needed to provide light for nighttime viewing of the license plate.

One potential apparatus for creating, storing, and processing vehicle data is available in conjunction with dynamic display that presents vehicle identification and registration information and can be arranged on the exterior of a vehicle. For example, U.S. Pat. No. 9,007,193, and pending published US Patent application US20130006775, both assigned to ReviverMX, describe a dynamic display that improves updateability of vehicle identification and registration information by use of a digital license plate.

However, digital license plates do require a significant amount of electrical power to operate and display required licensing information. A power supply system able to support operation when the vehicle is turned on or off, in conjunction with a range of local and remote communication systems, as well as in a wide range of thermal and environmental conditions, is necessary. These can be provided by use of sensor connected processor, and a digital license plate that supports various states, as discussed herein.

SUMMARY

A power system for a digital license plate includes a sensor, storage memory, and a battery status monitor operable only during operation of the digital license plate. The battery status monitor includes an analog to digital converter (ADC) connected to a battery to provide status data to a processor in the digital license plate, with status data being stored in the storage memory. A determination of battery lifetime being made at least in part using the status data and input from the sensor. In some embodiments status data can include external temperature.

In some embodiments, digital license plate operation states include an off state, a sleep state, a wake state, and a semi-wake state, with battery lifetime determination only being made in a wake state. Switches between operation states can be triggered in response to detected vehicle voltage, vehicle motion, wireless connection status, location or location changes, or real time clock (RTC) information. Allowed operational states, frequency of operational states, which electronic subsystems can be activated or deactivated can be determined at least in part by determined battery lifetime.

In some embodiments battery lifetime determinations are provided to a remote device over a wireless connection.

In some embodiments the sensor is an external temperature sensor. A battery health lookup table that uses external temperature sensor data and ADC data can be used to determine battery health.

In other embodiments, a method for measuring battery health in a digital license plate includes responding to a sensor triggered operational state that activates the digital license plate. A processor, memory, and ADC connection to a battery is woken, and battery voltage is read through the ADC connection with the results being stored in memory. The processor can then be used to determine battery health at least in part using the read battery voltage.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified.

DETAILED DESCRIPTION

Figure 1:
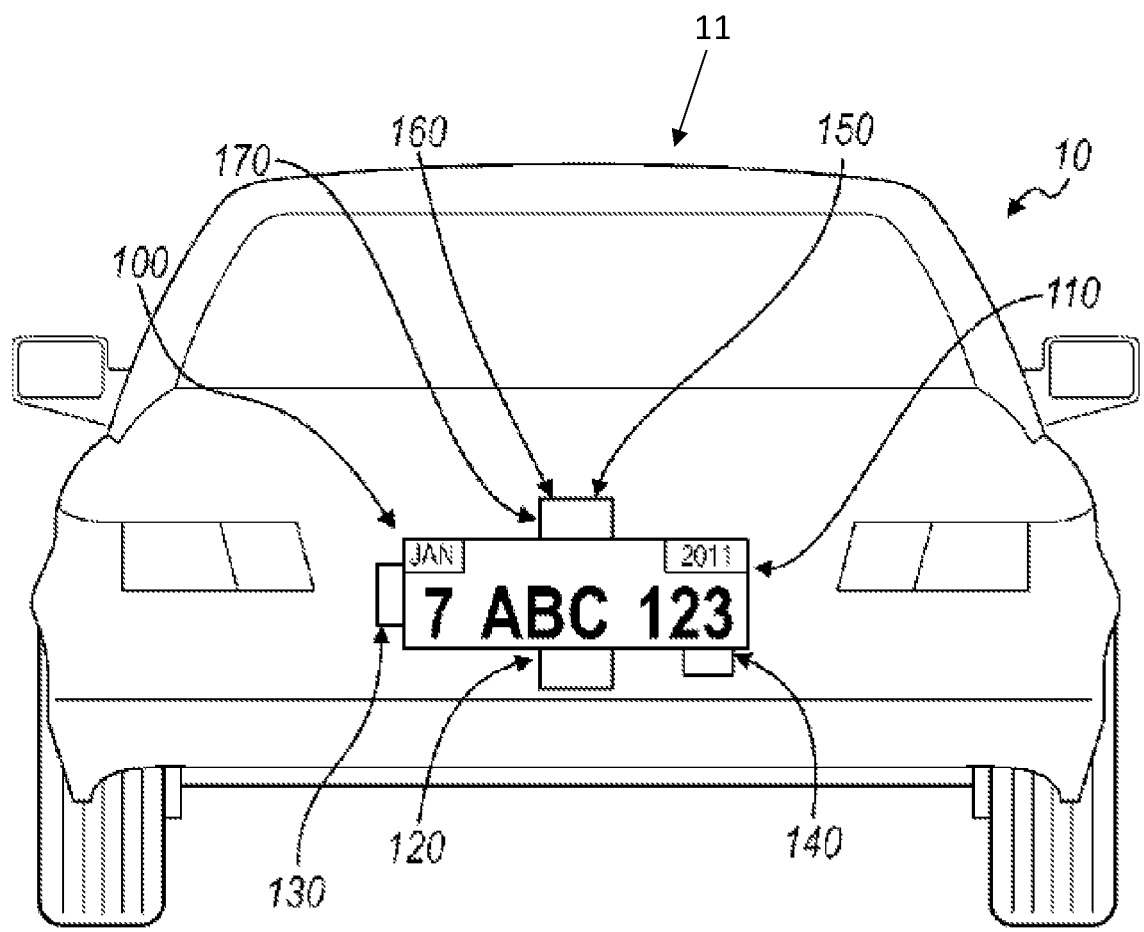
FIG. 1 illustrates one embodiment of a digital license plate system.

FIG. 1 illustrates one embodiment of a digital license plate system 11 supporting a dynamic display that presents vehicle identification and registration information and can be arranged on an exterior of a vehicle 10. The system 10 includes a display system 100 for use on the exterior of a vehicle 10 includes a display 110, a vehicle speed sensor 120, and a processor 130 coupled to the vehicle speed sensor 120. The processor 130 is configured to implement one of three operational modes of the display system 100 based on the speed and state of the vehicle 10: a first operational mode, wherein a first content, including identification information of the vehicle 10 and/or registration information of the vehicle 10 is rendered on the display 110 at a first power consumption level; a second operational mode, wherein a second content, including a message, identification information of the vehicle 10, and/or registration information of the vehicle 10, is rendered on the display 110; and a third operational mode, wherein content is rendered on the display 110 at a second power consumption level less than the first power consumption level. The display system 100 preferably also includes a communication device 140 that allows content (for example, updated identification information, registration information, and/or messages) to be transferred to and from the display system 100. The display system 100 may also include a location sensor 160, for example, a Global Positioning System (GPS) device, a cellular tower location triangulation device, or any other suitable location sensor that determines the location of the vehicle 10 on which the display 110 is arranged. The location sensor 160 may provide a substantially general location or a substantially exact location of the vehicle. Additionally, the display system 100 may include a storage device 150 that functions to store content; the processor 130 may retrieve content from the storage device 150 and render it on the display 110. The display system 100 may further comprise a sensor that determines the proximity of the vehicle 10 to a second vehicle.

The digital license plate system 11 is preferably used for registered vehicles such as personal cars, trucks, motorcycles, rental cars, corporately-owned cars, or any other suitable type of vehicle. The display system 100 functions to render identification and/or registration information of the vehicle 10 that is preferably provided by an official authority, such as a Department of Motor Vehicles (DMV). Preferably, the processor 120 renders the identification and/or registration information of the vehicle 10 on the display 110 such that a state vehicle code is followed, such as the size and dimension of the displayed area, the content, size, and lettering style of the information, and the visibility and reflectivity of the display 110. Preferably, the processor 120 renders content on the display 110 such that the state vehicle code of the state in which the vehicle 10 is registered is followed; alternatively, such as in the embodiment of the invention that incorporates a location sensor (such as a GPS device), the processor 120 may render content on the display 110 such that the state vehicle code of the state in which the vehicle is located is followed. The display system 100 preferably functions to display a message in addition to the vehicle identification and/or registration information. The message is preferably provided by an advertiser, for example, an advertiser that is substantially unrelated to the user. The subject matter of the advertisement provided by the advertiser may be substantially unrelated to the driver and/or owner of the vehicle 10, and the advertisement may be substantially unrelated to the vehicle 10. Alternatively, the advertisement may be related to a demographic to which the driver and/or owner of the vehicle 10 belongs or to any other suitable characteristic of the driver and/or owner of the vehicle 10. The advertisement may also be selectable by the driver and/or owner of the vehicle 10, for example, via the Internet on a personal computer, via the internet on an internet-capable mobile phone, or via any other suitable method. The advertisement may also be substantially related to the vehicle 10, for example, a display system mounted to a Porsche may display advertisements that are targeted at a demographic with a brand affinity toward Porsches. The advertisements may be substantially related to the location of the vehicle 10, for example, if the vehicle 10 is traveling within the vicinity of a venue, an advertisement for the venue may be shown. Alternatively, the message may be provided by a law enforcement agency, for example, an emergency broadcast regarding a missing person (for example, an Amber or an Elder alert). Furthermore, if the vehicle 10 is reported stolen, the message may indicate that the vehicle 10 is stolen, thus allowing parties external to the vehicle to identify the vehicle 10 as such.

Alternatively, the message may be any suitable type of message and may be controlled by any suitable party, for example, an official organization (for example, the DMV), the driver of the vehicle 10, the owner of the vehicle 10, a third party unrelated to the vehicle 10, or any other suitable party. In a first example, the message may include additional details related to the vehicle 10, including the model of the vehicle 10, the smog check results of the vehicle 10, maintenance issues of vehicle 10, or any other suitable type of information related to the vehicle 10. In a second example, the message may include details related to the driver of the vehicle 10, including organizations that the driver supports or belongs to (for example, the Girl Scouts, the San Francisco Giants baseball team, or a political party), a cause that the driver supports (for example, People for the Ethical Treatment of Animals (PETA) or cancer awareness), the demographic of the driver, or any other suitable type of information related to the driver. In this second example, the message may also include official details regarding the driver; for example, the message may indicate that the driver is a doctor or a law enforcement officer, allowing people outside the vehicle 10 to direct requests to the driver when his services are desired. Official details may also include details relating to the driving history of the driver; for example, if the driver has an imperfect driving record, a notification may be rendered on the display in order to warn others in the vicinity of the vehicle. In a third example, the message may include notifications for drivers in the vicinity of the vehicle 10, for example, traffic information or weather forecasts. In a fourth example, the message may include details regarding the owner of the vehicle. This may be particularly useful when the vehicle 10 is a member of a fleet of cars, for example, a car rental agency, a moving truck rental agency, a government fleet, or any other suitable type of fleet. The message of the fourth example may indicate which fleet the vehicle 10 belongs to; this information may be used to identify vehicles, to advertise regarding the fleet (for example, if the vehicle 10 belongs to a rental car agency, the message may include an advertisement or a message for that particular rental car agency), or for any other suitable purpose. However, the message may be of any other suitable type of message.

The display system 100 is preferably powered by a power source. The power source is preferably a power source of the vehicle 10, such as the accessories battery of the vehicle 10, the engine of the vehicle 10, or any other suitable power source of the vehicle 10. Alternatively, the display system 100 may include and be powered by a power source that is substantially independent from a power source of the vehicle 10. The power source of the display system 100 is preferably a battery, but may alternatively be a solar panel, wind generator, or any other suitable type of power source or combination of power sources. Yet alternatively, the display system 100 may include a power source that is rechargeable and coupled to a power source of the vehicle 10 that stores power from the vehicle 10 while the vehicle 10 is in operation and/or the ignition of the vehicle 10 is on. In this variation, the power source of the display system 100 allows for power generated while the vehicle is in operation to be used at a later time by the display system 100. However, the display system 100 may be powered using any other suitable method and/or arrangement.

The display 110 functions to display content, wherein content includes at least one of the identification information of the vehicle 10, registration information of the vehicle 10, and a message. The display 110 is operated by the processor 130 in one of the three operational modes. The display 110 is preferably of a substantially low power display, such as an LED display, an LCD display, an e-ink display, an organic LED display, an interferometric modulator display (iMoD), a display that uses electrophoretic deposition (EPD), a cholesteric liquid crystal display (ChLCDs), or any other suitable display. The display 110 may alternatively be a combination of the above display types. The display 110 preferably also has a substantially wide range of viewing angles. The display 110 is preferably also substantially thin, allowing the display 110 to replace existing license plates on the rear and/or front exterior of the vehicle. Similarly, the display 110 is preferably of a width, height, and/or aspect ratio that is/are substantially similar to existing license plates. Alternatively, the display 110 may be substantially different than existing license plates (for example, in the case of the relatively narrow height of European license plates, the display 110 may be of a substantially different height). However the display 110 may be of any other suitable dimension.

The display 110 may also include a backlight. The backlight functions to control the light intensity of the information displayed by the display 110. The backlight preferably includes a plurality of degrees of light intensity. The processor 130 may select the degree of light intensity based upon the mode of operation. The processor 130 may also select the degree of light intensity based upon ambient light levels proximal to the display 110. For example, the degree of light intensity may be higher during the day and lower during the night. In this variation, the display system 100 also includes a light sensor to detect the level of ambient light. The degree of light intensity of the display system 100 may also be selected based on the preferences of the driver, a law enforcement officer, or any other suitable party. However, the degree of light intensity of the display system 100 may be selected based on any other suitable criteria. The backlight may be a set of lights located substantially on the perimeter of the display 110 and that are directed toward the display 110. Alternatively, the backlight may be located substantially behind the display 110 and provide light from behind the display 110. However, the backlight may be of any other suitable arrangement. The backlight may be a series of low-power light sources, such as LEDs, but may alternatively be any other type of light source. Alternatively, the display may include a light-reflective surface that functions to illuminate the display 110 with reflected light. The light-reflective surface may be a mirror or any other suitable type of reflective material. The light-reflective surface may also be of a retroreflective material that reflects light back in the direction of the light source. The light-reflective surface may also be combined with a light source to more effectively illuminate the display 110, for example, the transflective materials used on freeway signs. However, any other suitable material or method may be used to illuminate the display.

The vehicle speed sensor 120 functions to detect the speed of the vehicle 10. The vehicle speed sensor 120 is preferably a sensor that measures the actual velocity and/or acceleration of the vehicle 10, such as an accelerometer coupled to the vehicle 10 or a tachometer coupled to the drivetrain of the vehicle 10 and which measures the number of revolutions of a drivetrain component, such as a wheel, for a period of time in order to determine the speed of the vehicle 10. In a second variation, the vehicle speed sensor 120 couples to the speedometer of the vehicle 10 and/or an onboard computer of the vehicle 10; in this configuration, the speed sensor 120 functions to transmit information gathered by the speedometer and/or the onboard computer to the processor 130, rather than measure the vehicle speed directly. However, the vehicle speed sensor 120 may be any other suitable type of sensor that determines the actual speed and/or acceleration of the vehicle 10. Alternatively, the vehicle speed sensor 120 may be a sensor that measures the relative velocity and/or acceleration of the vehicle, for example an ultrasonic sensor or an infrared sensor that determines the speed of the vehicle relative to another object. The other object may be a stationary portion of the road or a nearby vehicle. However, the vehicle speed sensor 120 may determine the speed of the vehicle 10 using any other suitable method or sensor type.

The processor 130 functions to render content on the display 110 based upon the operational mode of the display system 100: a first mode, wherein a first content is rendered on the display 110 at a first power consumption level, the first content including identification information of the vehicle 10 and/or registration information of the vehicle 10; a second mode, wherein a second content is rendered on the display 110, the second content including a message and possibly including identification information of the vehicle 10 and/or registration information of the vehicle 10; and a third mode, wherein content is rendered on the display 110 at a second power consumption level that is less than the first power consumption level. Preferably, content rendered in the third operational mode includes the identification and registration information of the vehicle 10. In a variation of the display system 100, content rendered in the third operational mode includes a message in addition to the identification and/or registration information of the vehicle 10. However, content rendered on the display 110 in the third operational mode may include any other information or messages or any combination thereof.

The processor 130 is preferably coupled to the vehicle speed sensor 120. As mentioned above, the speed determined by the vehicle speed sensor 120 may be the actual speed of the vehicle 10 or may alternatively be the speed of the vehicle 10 relative to another object (for example, a neighboring vehicle). The processor 130 preferably selects the operational mode of the display system 100 based on the speed and power state of the vehicle 10. However, a device other than the processor, such as the onboard computer of the vehicle 10, a law enforcement officer, a second processor connected to a remote server, or any other suitable device or institution may select the operational mode of the display system 100. The processor 130 preferably operates the display 110 in the first and second operational modes when the vehicle 10 is on, and the processor preferably operates the display 110 in the third operational mode when the vehicle 10 is off. The vehicle 10 is preferably considered "on" when the driver turns any portion of the vehicle 10 on. In many cars, there is a plurality of "on" states, for example, a first "on" state in which basic functionality, such as opening and closing windows, is allowed; a second "on" state in which more advanced and/or higher-power functionality, such as ventilation systems or the sound system, is allowed; and a third "on" state in which the vehicle may be driven (or, in other words, the ignition is on). The vehicle 10 may be considered "off" otherwise. In the "off" state, certain portions of the vehicle may still be "on", for example, security sensors, key proximity sensors (such as keyless entry), or any other type of substantially-low-power functionality. Alternatively, the vehicle 10 may be considered "on" when the ignition is on and considered "off" when the ignition is off, regardless of any other functionality that the vehicle may provide to the driver. Yet alternatively, the vehicle 10 may be considered "on" when the presence of a person is detected within the vehicle and "off" when there is no one within the vehicle. The vehicle 10 may also be considered off when the emergency brake or transmission parking brake of the vehicle 10 is engaged, regardless of the state of the ignition or presence of a person within the vehicle 10. However, the vehicle may be considered "on" and "off" using any other suitable criteria. The processor 130 preferably operates the display 110 in the first operational mode when the vehicle 10 is at a first speed and preferably operates the display 110 in the second operational mode when the vehicle 10 is at a second speed lower than the first speed. The second speed is preferably substantially zero speed, or substantially close to zero speed. This allows for identification and/or registration information of the vehicle 10 to be substantially visible while the vehicle 10 is in motion (the first speed), as shown in FIG. 1. This allows any party external to the vehicle 10 to visually access the information rendered on the display 110 in a manner similar to that used to visually access information on a static (or stamped) license plate. In one variation, the processor 130 operates the display 110 in the second operational mode and renders the second content on the display 110 when the vehicle 10 is on and at the second speed, wherein the second speed is preferably zero speed or a substantially slow speed, such as when the vehicle is moving slowly through heavy traffic. Because the message depicted in the second mode takes up a portion of the display area of the display, the identification and/or registration information also depicted may consume a smaller portion of the display area in the second operational mode as compared to the first operational mode. Because the identification and registration information is depicted in a is smaller size on the display 110 when a message is displayed concurrently with the vehicle 10 information, the visibility of the identification and registration information may be less in the second operational mode than in the first operational mode. Alternatively, the identification and/or registration information rendered on the display 110 in the second operational mode may be of the same or similar format (for example, size and layout) as in the first mode, but the message may be rendered on the display to overlap the identification and/or registration information. This may also result in reduced visibility of the identification and/or registration information of the vehicle 10. Therefore, the message may be displayed only under such conditions as when the vehicle is stopped or nearly stopped so that decreased visibility of the identification and/or registration information does not occur when the vehicle 10 is moving at a substantial speed; however, the additional functionality of displaying the message when the vehicle is at the second speed still remains. Additionally, the message may provide an undesired distraction for a party outside of the vehicle 10 while the vehicle 10 is in motion, and thus, by only displaying the message while the vehicle is stopped or nearly stopped, the possibility of distraction may be substantially reduced. However, the processor 130 may alternatively operate the display 110 in the first and second operational modes at any other suitable speed arrangement. In a variation of this, the display system 100 may enhance legibility of the information for a party outside of the vehicle 10 by horizontally mirroring content rendered on the display 110 when the display 110 is mounted on the front exterior of the vehicle 10; in this variation, content rendered on the display may be read in the correct orientation by a party viewing the display 110 in a rearview or side mirror of a second vehicle located ahead of the vehicle 10. However, the processor may render content on the display 110 by any other means or arrangement such that distraction caused by the display 110 is reduced and legibility of the displayed content is improved.

As described above, the processor 130 preferably functions to operate the display 110 in the third operational mode when the vehicle 10 is off. The third operational mode preferably displays identification and registration information of the vehicle 10 at a second lower power consumption level that is less than the first power consumption level. In a variation of this, a message is rendered on the display 110 in addition to the identification and registration information of the vehicle 10, although any one or combination of a message, identification information of the vehicle 10, registration information of vehicle 10, or any other information may be rendered on the display 110 when in the third operational mode. When the vehicle 10 is off, the power available to the display system 100 may be less than when the vehicle is on. For example, in the variation wherein the display system 100 obtains power from a power source of the vehicle 10, the display system 100 may be utilizing energy that was stored from another period of time when the vehicle was on. Thus, there is a limited supply of power, and by operating the display 110 at a lower power consumption level in the third operational mode than in the first and/or second operational modes while the vehicle is off, the length of time that content may be rendered on the display 110 may be increased for a given amount of energy available to the display system 100.

The operation of the display 110 in the third operational mode may reduce the power consumption of the display system 100 in a variety of arrangements. In a first variation, the display 110 may be turned off at a first time and turned on at a second time. The display 110 may be timed to cycle on and off at specific time intervals, for example, every five minutes. The driver, the owner, or any other suitable party may adjust the intervals. This allows the display 110 to be turned off for a length of time and turned on for another length of time. The length of time that the display 110 is turned off is preferably substantially longer than the length of time that the display 110 is turned on, which substantially decreases the power consumption of the display 110. In a further variation, when in the third operational mode, content may be rendered on the display 110 in colors that require less power to display, as compared to when operating in the first operational mode. However, the processor may operate the display 110 by any other means that reduces power consumption of the display 110 when in the third operational mode, as compared to the first operational mode. Furthermore, the processor 130 may reduce the power consumption level of the processor 130 when in the third operational mode, for example, by reducing clock speed, shutting down auxiliary functions such as transmitting data to and/or receiving data from the communications device 140, or any other method to reduce power consumption of the processor 130. When the processor 130 operates the display in the third operational mode, the light intensity of the display 110 may be substantially identical to the light intensity of the first and/or the second operational modes. Alternatively, because the vehicle 10 is presumed to be stationary when off (a possible exception to this presumption would be when the vehicle 10 is being towed) and the party to which message and/or identification information and/or registration information is to be shown is substantially proximal to the vehicle 10, the light intensity of the display 110 may be substantially less in the third operational mode than in the first and/or second operational modes. However, any other suitable light intensity may be used in the third operational mode.

In a second variation, the display may be continuously on when operating in the third operational mode but at a substantially lower light intensity than in the first and/or second operational modes. In a first example, the backlight of the display 110 may be at the lowest light intensity in the third mode. In a second example, in the variation of the display 110 that is e-ink, the backlight of the display 110 may be turned off, allowing only the e-ink, which is bistable and does not require additional power to maintain, to be visible. The method and arrangement to decrease the power consumption of the display 110 in the third operational mode is preferably one of the two above variations, but may alternatively be a combination of the above variations or any other suitable method or arrangement.

The processor 130 may alternatively operate the display 110 in a fourth operational mode. The fourth mode may be determined by communication through the communication device 140. In a first example, the communication device 140 may communicate with a law enforcement agency and may indicate to the processor 130 that the vehicle 10 has been stolen. The processor 130 may then operate the display 110 in a fourth operational mode in which a notification that the vehicle 10 is a stolen vehicle is rendered on the display 110. However, the fourth mode may alternatively be of any other suitable type and actuated by any other suitable method.

The communication device 140 functions to allow content, information, and/or data to be transferred to and from the display system 100. The communication may be conducted with an official organization (such as a DMV office or a law enforcement agency), a content database, the driver of the vehicle, the owner of the vehicle, or any other suitable party. The communication device may transmit and/or receive information regarding vehicle identification and/or registration information, vehicle maintenance information, driver information, vehicle location information (for example, in the variation of the display system 100 that includes a GPS location device or accesses GPS location services), updated advertisements, or any other suitable type of information. The communication device 140 is preferably of a wireless communication type, for example, one that communicates with cellular phone towers, Wi-Fi hubs, or any other suitable type of wireless communication. However, the communication device 140 may be a wired communication device. In this variation, updated information is transferred when the display system 100 is "plugged in" to an updating device, for example, a computer at a maintenance facility, at a DMV office, or any other suitable location, or another vehicle and/or display system 100 that has wireless communication capabilities. The communication device 140 may also include a communication processor that functions to interpret communications to and/or from the display system 100. The communication processor is preferably separate from the processor 130, but may alternatively be the processor 130. The communication processor may function to encrypt and/or decrypt communications to and/or from the display system 100. The encryption/decryption may be any one of a variety of authentication and encryption schema. For example, cryptographic protocols such as Diffie-Hellman key exchange, Wireless Transport Layer Security (WTLS), or any other suitable type of protocol. The communication processor may also function to encrypt data to encryption standards such as the Data Encryption Standard (DES), Triple Data Encryption Standard (3-DES), or Advanced Encryption Standard (AES). However, the communication device 140 may allow any other suitable type of communication and may be of any other suitable arrangement.

The communication device 140 may receive content, information, and/or data from a content database. Preferably, the content database is arranged substantially remote from the processor 130. The content database also preferably contains content provided by an institution, for example, an advertiser, a school, a record company, or a sports team or venue; content provided by the institution preferably includes advertisements. Alternatively, the content database may contain content provided by the driver and/or owner of the vehicle 10, for example, a message composed by the owner of the vehicle 10 congratulating a child upon graduation from high school. However, any other suitable party may provide content to the content database, and the content database may include a combination of advertisements from one or more institutions and personal messages from one or more individuals. In a first example, content on the content database is accessed by the processor 130 via the communication device 140 and stored on the storage device 150. Preferably, the storage device 150 is arranged substantially proximal to the display 110, such as within the vehicle 10 or within a housing containing the display 110; however, the storage device 150 may be located remotely from the vehicle 10, such as on a hard drive connected to a remote server. In a second example, content on the content database is accessed via the communication device 140 in real time and then rendered on the display 110, thereby bypassing storage of content on the storage device 150. However, content from the remote message database may be accessed by any other means before being rendered on the display 110. In a third example, the storage device also functions as the content database, wherein content from at least one institution or individual, such as those listed above, may be stored on the storage device and also selected by the driver and/or owner of the of vehicle 10 to be rendered on the display 110. In this variation, the storage device 150 of the display system 100, also functioning as a content database, may be accessed by a second display system separate from the display system 100, such as a display system arranged on a second vehicle. However, any other suitable party may select the content to be rendered on the display 110 from the content database. Furthermore, content on the content database may be selected, accessed and/or modified by the driver and/or owner of the vehicle 10, or any other suitable party, via an interface. Preferably, the interface is internet-based and accessible via a web browser, for example, on a mobile smart phone or on a computer. In a first example, the driver and/or owner of the vehicle 10 may access interface with an internet-capable mobile phone, then log into the content database and select content (for example, a San Francisco Giants Baseball banner) he wishes to be rendered on the display 110. In a second example, the content database stores vehicle registration information, and upon the renewal of the registration of the vehicle 10, a DMV representative may access the content database via a computer equipped with the interface and then update the registration information of the vehicle 10 on the content database; the communication device 140 may then retrieve the updated registration information from the content database and the registration information subsequently rendered on the display 110 may reflect the renewal. Alternatively, the interface may be a handheld device that is hardwired, or physically "plugged in", to the display system 100. In this variation, the interface may or may not be removable from the display system 100. Furthermore, the interface may not couple to the content database via the communication device 140, but instead only provide the driver and/or owner of the vehicle 10, or any other suitable party, to access content already located on the display system 100, such as on the storage device 150 arranged substantially proximal to the display 110. For example, a law enforcement officer, upon pulling over the driver of the vehicle 10 for a traffic violation, may hook up to the display system 100 arranged on the vehicle 10 a device equipped with the interface, wherein the interface provides access to the current identification and/or registration information of the vehicle 10. However, the interface may permit access to any content contained in any other device coupled to the display system 110 and by any other means.

The communication device 140 may transmit data regarding the rendering of a particular content on the display 110. Preferably, an advertisement is included in the content rendered on the display 110, and the communication device 140 transmits data regarding the rendering of the advertisement on the display 110. This data may include, for example, how long the advertisement was displayed, when it was displayed, and where it was displayed. Alternatively, this data could be collected and/or stored by the processor 130, although it could be collected and stored by any other device or means. Preferably, this information is used to determine the magnitude or type of an award granted to the driver and/or owner of the vehicle 10. In a first example, if an advertisement for tickets to a baseball game featuring a given team is rendered on the display 110, the driver and/or owner of the vehicle 10 may receive a monetary award commensurate with the length of time that the advertisement was rendered on the display 110; alternatively, the owner and/or driver of the vehicle 10 may receive one or more tickets to a baseball game featuring this team in return for displaying the advertisement in an area with a relatively low attendance at baseball games. However, any other method may be used to grant an award of any other type to the driver and/or owner of the vehicle 10 in return for the rendering of content on the display 110.

The sensor for determining the proximity of the vehicle 10 to a second vehicle functions to indicate to the processor 120 to modify content rendered on the display 110. The processor 120 preferably renders a message, such as an advertisement, on the display 110 when the second vehicle is substantially proximal to the vehicle 10 (such as in the second mode); the processor 120 preferably renders the identification and registration information of the vehicle 10 on the display 110 when the sensor detects that no second vehicle is substantially proximal to the vehicle 10 (such as in the first mode or the third mode). The sensor may be a RADAR detector, a LIDAR detector, an IR transmitter-photoresistor pair, a camera, or any other suitable device configured to detect the proximity of the vehicle 10 to a second vehicle. In the embodiment of the sensor that is a camera, the camera may be configured to detect identification information of the second vehicle (such as the license plate number of the second vehicle); this information may be used to determine the owner of the second vehicle and obtain information relating to the owner of the second vehicle. The processor 120 may then modify content rendered on the display 110 based upon the demographic of the owner of the second vehicle, such as by displaying an advertisement for discount prescription medications if the owner of the second vehicle is determined to be at least sixty years of age; by displaying an advertisement for a women's fashion store if the owner of the second vehicle is determined to be female; or by displaying driver information if the second vehicle is determined to be owned by or used by a law enforcement agency. In this example, identification information of the second vehicle may be transmitted to a database of vehicle identification information, wherein the database returns information about the owner of the second vehicle 10, such as age, ethnicity, or gender; the database may be maintained by an entity such as a DMV or the American Automobile Association (AAA). Alternatively, the camera may be configured to determine directly the demographic of the driver of the second vehicle (for example, by matching the driver to a specific ethnicity by with facial recognition software) or the response of the driver of the second vehicle to a message rendered on the display 120. In the latter example, the response of the driver of the second vehicle may be used to pick an alternative message that may produce a more favorable response if the initial response is negative, or to choose a similar message if the first response is positive. Furthermore, in the embodiment in which the sensor is a camera, the camera may be used to measure the level of ambient light substantially proximal to the vehicle 10 such that content may be rendered on the display at an appropriate light level; for example, the brightness of the display may increase if the camera determines a high level of sunlight near the vehicle 10. However, the sensor may detect any other information relevant to the second vehicle and indicate to the processor 120 to modify content rendered on the display based upon any other variable.

Figure 2:
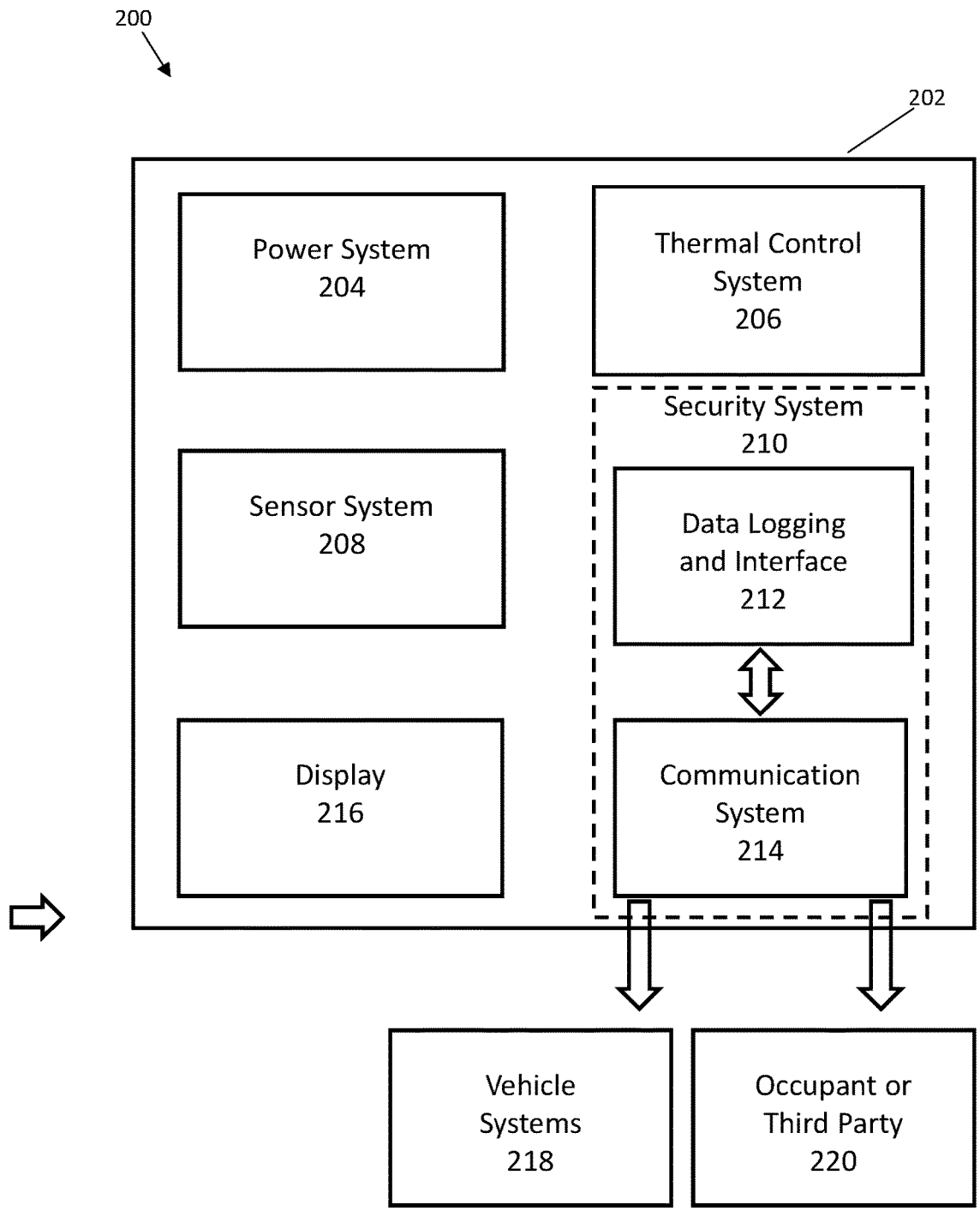
FIG. 2 is illustrates various systems in a digital license plate system.

FIG. 2 illustrates various systems, sub-systems, or modules that can be incorporated into a digital license plate system 200, along potential interacting agents such as vehicle systems 218, vehicle occupants, or third party persons or automated systems 220. In this Figure, a digital license plate 202 can be mounted on a vehicle. Systems within the digital license plate can include, but are not limited to, a power system 204, thermal control system 206, and sensor system 208. An electronic security system 210 limits unauthorized access to data logged and distributed via a data logging and interface system 212, or any received/transmitted communications through communication system 214. Received data can be used to determine or update information presented by display 216.

Figure 3:
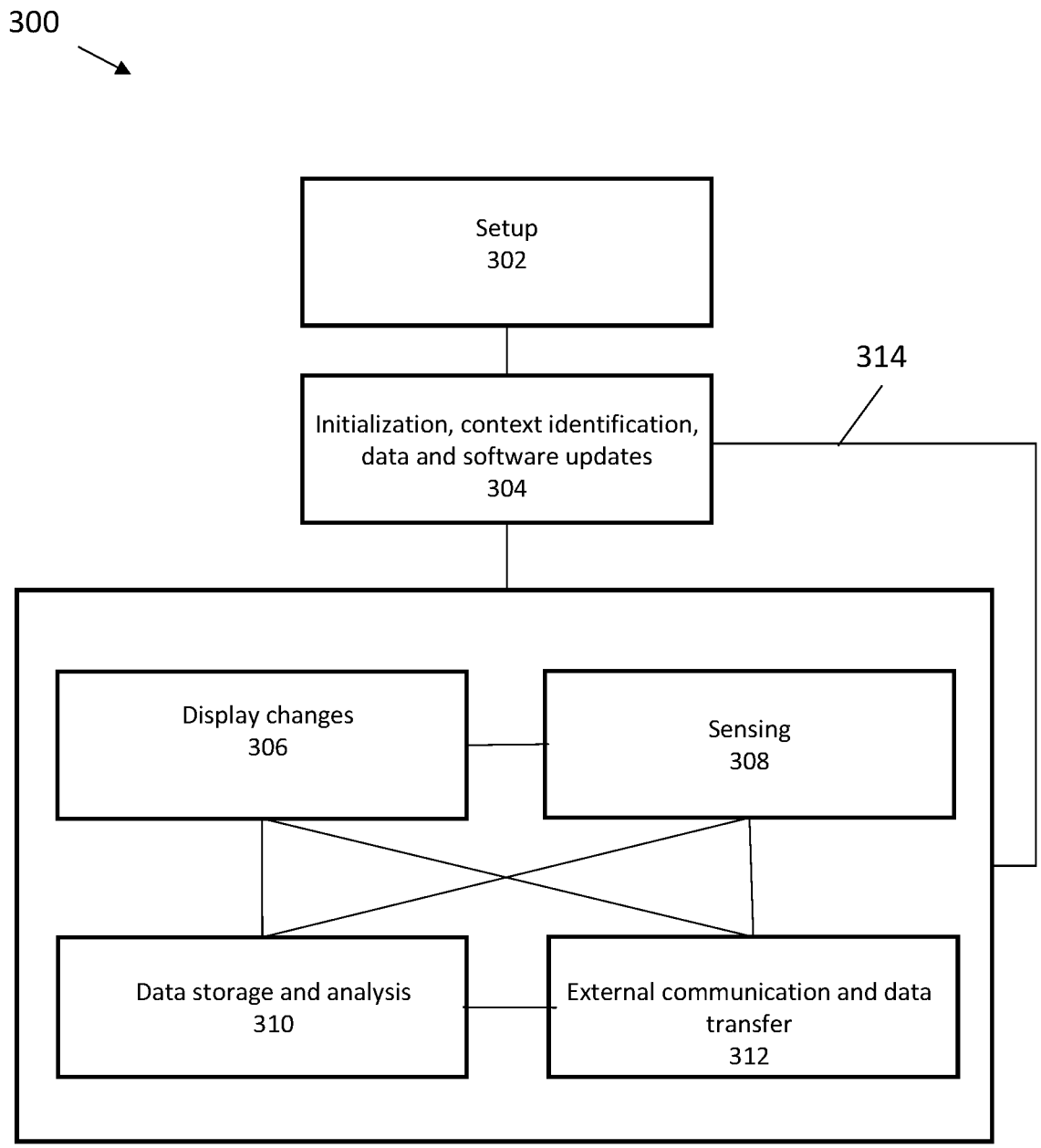
FIG. 3 illustrates operation of a digital license plate system.

FIG. 3 illustrates a method for operation of one embodiment of a digital license plate system. After an initial setup 302 to register and link a digital license plate to a specific vehicle, the digital license plate can be ready for initialization 304 on vehicle startup (or alternatively, on vehicle stop), and can use timers or sensors to help identify context, location, or display presets for the digital license plate. Data uploading/downloading can be initiated, and any firmware/software updates completed. In normal operation, changes 306 to the display can occur in response to sensed data 308, from data storage or analysis system 310, or as a result of external communication and data transfer 312. Similarly, sensed or stored data can be transmitted or received, and the sensors activated, deactivated, or sensor data analyzed based on internal triggers or externally received data. When a vehicle stops, or in response to a timing or other suitable trigger, data can be transferred (via line 314) back to the initialization step 304.

Figure 4A:
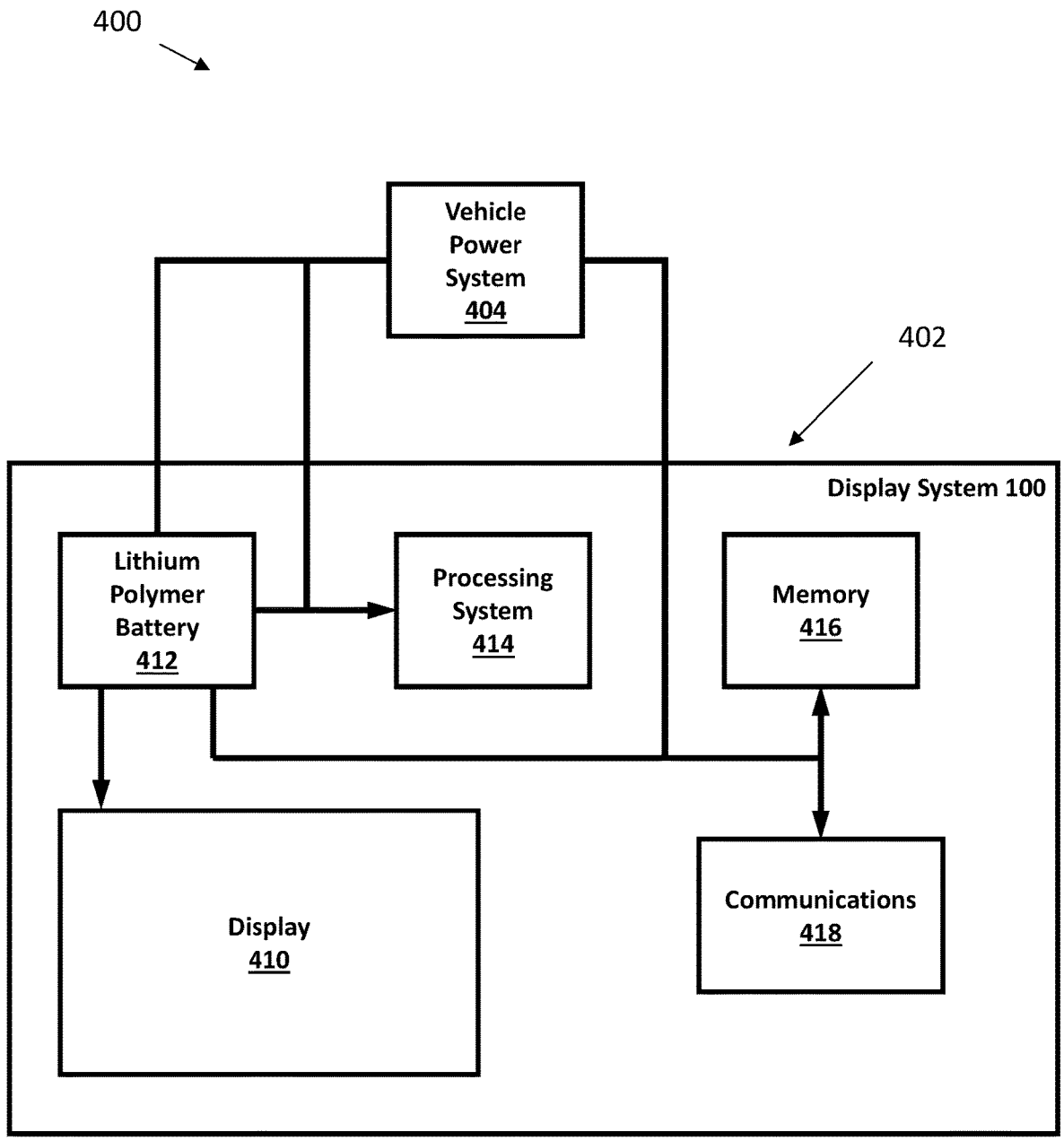
FIG. 4A is an embodiment of an on-module battery power system.
Figure 4B:
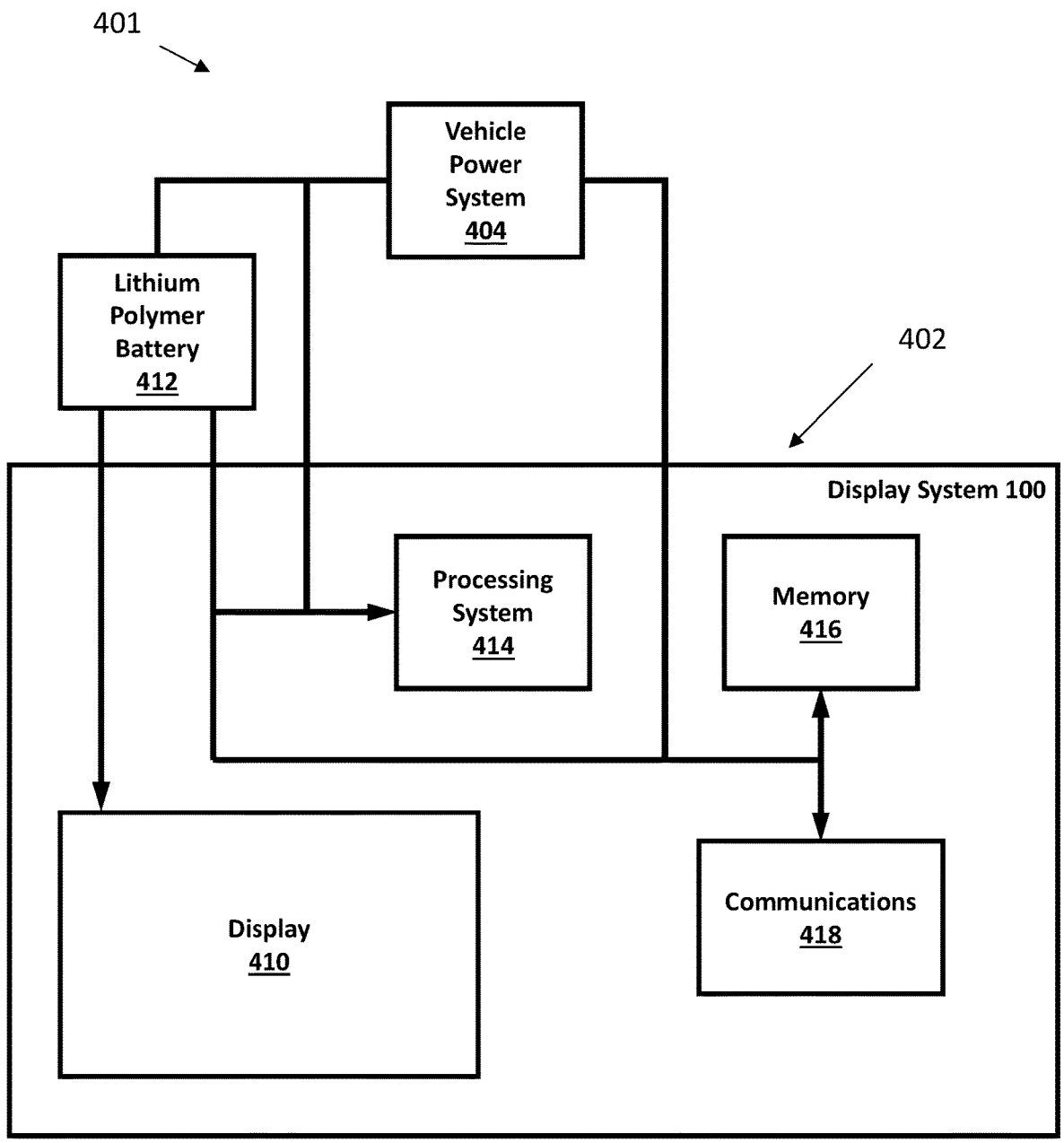
FIG. 4B is an embodiment of an off-module battery power system.

FIGS. 4A and 4B respectively depicts embodiments of display system 400 having an internal battery (FIG. 4A) and external battery (FIG. 4B). For example, mounted within an externally attachable module 402 is a battery 412 to supply power to a processing system 414, a memory module 416, a communications module 418 and display 410. Power can also be supplied by a vehicle power system 404, either directly or via recharge of the battery 412. In some embodiments, battery 412 may be a lithium polymer, a nickel-cadmium, lead acid, Lithium Ion, Lithium Air, Lithium Iron Oxide, Nickel Metal Hydride, absorbent glass mat (AGM), or a valve-regulated lead-acid (VRLA) battery. FIG. 4B shows display system 401, an alternative to that depicted in FIG. 4A. In that embodiment, the battery 412 can be positioned within the vehicle, external to externally attachable module 402. Advantageously, this can allow use of larger batteries, or batteries of differing chemistries, including conventional rechargeable lead-acid batteries.

When a vehicle associated with display system 400 is powered on, the display system 400 is normally supplied with power from the vehicle systems. In some embodiments, the power supplied to display system 400 by vehicle systems may be of 12V. In other embodiments, other voltage values may be implemented. When the vehicle is powered off, display system 400 may still need to be powered on to display, for example, vehicle registration information. In some embodiments, display system 400 may need to be powered on substantially all the time. During the vehicle powered off state display system 400 draws power from battery 412.

Figure 5:
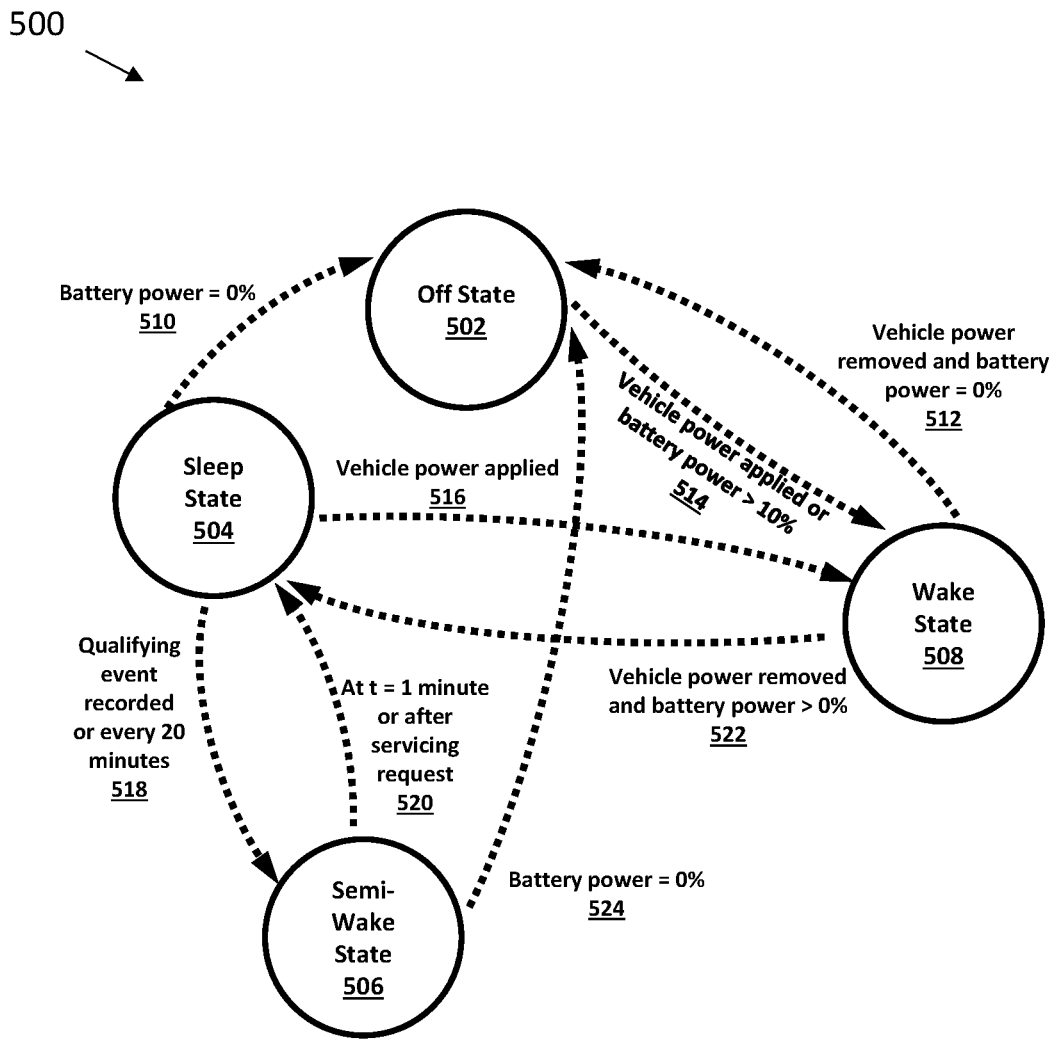
FIG. 5 is a state diagram for a power system.

As seen with respect to FIG. 5, position on a power state chart 500 for a display system 400 can depend on the availability and requirements of electrical power. Four states are described as associated with display system 100, including an:

Off state: Display system 400 is switched off, no processes are running

Sleep state: In this state, only a minimal number of processes are running, for example:
1. Real Time Clock
2. Capacitive Touch Monitoring
3. Accelerometer Monitoring In some embodiments, an infrared sensor may be used to detect motion around the digital display to trigger a wake state. In other embodiments, the processor may cause the plate to wake up at regular intervals.

Wake state: In this state, all device processes associated with display system 100 are running, including the processor, the communication module (including the cellular communication module, the Wi-Fi module, and the Bluetooth module), the digital display, the accelerometer, the gyroscope and the speed sensor.

Semi-wake state: In this state, all processes associated with the sleep state are running (as described above) and in addition, an image is displayed on display 110. In some embodiments, processing system 414 and a modem (not shown) may be powered up, with the modem being used to implement wireless connectivity (e.g. 3G or 4G cell service) to a remote server (not shown) by methods including but not limited to wireless internet access. Other processes could include back/front light control, or light/dark detection.

Transitions between states are initiated in response to battery and vehicle power levels, sensed capacitive touch, an accelerometer event (motion sensed), a cable disconnect (vehicle power disconnected), incoming SMS message (received via the modem), a timer signal, or infrared motion detection. Specifically, some transition triggers are described as follows:

Vehicle Power Removed

When 12V vehicle power is removed from the device, and the battery has sufficient charge (>10%) display system 400 will enter into sleep state. This transition will happen within 60 seconds. When the battery is fully discharged, the device will completely turn off.

Vehicle Power Applied

When 12V vehicle power is applied display system 100 will immediately go into wake state.

Capacitive Touch Recorded

When a touch is sensed display system 100 will transition from sleep to semi-wake state.

Accelerometer Event Sensed—When the accelerometer detects that the display system has been removed from a stationary vehicle.

In some embodiments, display system 400 transitions from sleep state to semi-wake state every 20 minutes, stays in semi-wake state for 1 minute, and then returns to sleep state. In other embodiments, other timing combinations may be implemented depending on the nature of the application. For example, display system 400 may transition from sleep state to semi-wake state every 60 seconds, stay in semi-wake state for 10 seconds, and then return to sleep state.

Returning to FIG. 5, starting from an off state 502 where all systems are powered down, if a condition where vehicle power is applied or battery power is greater than 10% 514 occurs then the system transitions to a wake state 508. If, from wake state 508, a condition where vehicle power is removed or battery power is 0% 512 occurs then the system transitions to off state 502. While in wake state 508, if a condition where vehicle power is removed and battery power is greater than 10% 522 occurs then the system transitions to sleep state 504. Conversely, while in sleep state 504, if a condition where vehicle power is applied 516 then the system transitions to wake state 508. While in sleep state 504, if a condition where battery power is 0% 510 occurs, then the system transitions to off state 502. While in sleep state 504, if a condition where a qualifying event is recorded (for example, a capacitive touch or infrared motion detection as discussed above) or 20 minutes have elapsed since a last state check 518, the system transitions to semi-wake state 506. If a condition occurs where the system is in semi-wake state 506 and 1 minute has elapsed or when the function associated with the qualifying event (recorded in step 518) is fulfilled 520 then the system transitions to sleep state. If a condition occurs where the system is in semi-wake state 506 and the battery power is 0% 524 then the system transitions to off state 502. The flow diagram in FIG. 5 captures the basic state flow process for digital display 100.

Figure 6A:
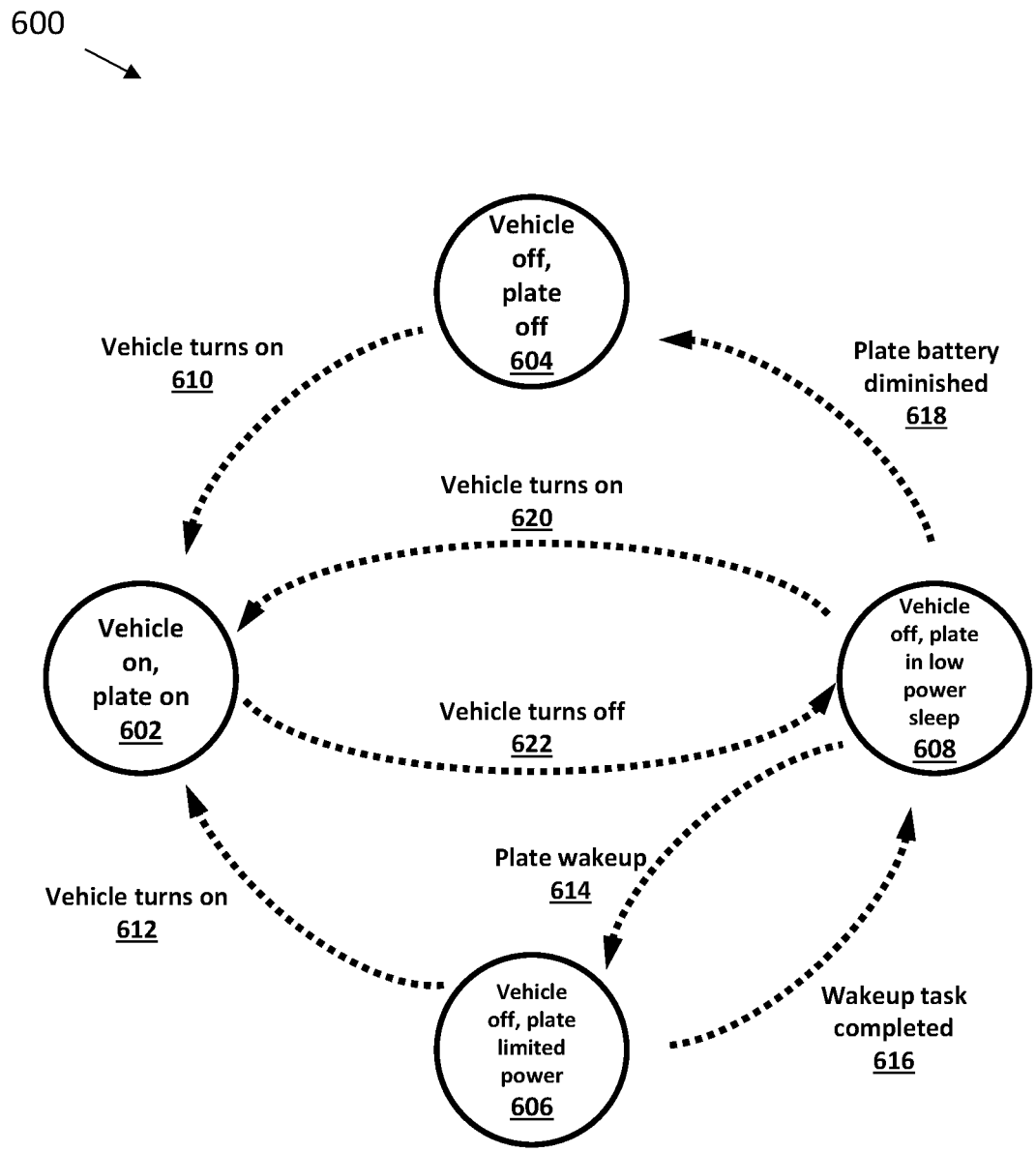
FIG. 6A is a power state diagram for an electrophoretic display.

FIG. 6A is a power state diagram 600 for an electrophoretic display. An electrophoretic display, also known as a bistable display, retains its state when external power is removed. In FIG. 6A, the term "plate" is used synonymously to refer to display system 100. Starting at a state where the vehicle is off and the vehicle power is off 604, if an event where the vehicle turns on 610 occurs, then the system switches to a state where the vehicle is on and the plate is on 602. If, in the state where the vehicle is on and the plate is on 602, an event occurs where the vehicle turns off 622, then the system transitions to a state where the vehicle is off, and the plate is in a low-power sleep mode 608. When the system transitions to the state where the vehicle is off, and the plate is in a low-power sleep mode 608, if the digital display 110 is an electrophoretic display, then the information on the display stays static and does not get erased. If the system is in a state where the vehicle is off, and the plate is in a low-power sleep mode 608 and the vehicle turns on 620, then the system transitions back to the state where the vehicle is on and the plate is on 602. If the system is in a state where the vehicle is off, and the plate is in a low-power sleep mode 608 and an event occurs where the plate battery power is diminished 618, then the system transitions to the state where the vehicle is off and the vehicle power is off 604. If the system is in a state where the vehicle is off, and the plate is in a low-power sleep mode 608 and an event occurs where a plate wakeup signal is received 614, then the system transitions into a state where the vehicle is off and the plate operates under limited power 606. Wakeup signals are triggered by any combination of sensed capacitive touch, an accelerometer event (motion sensed), a cable disconnect (vehicle power disconnected), incoming SMS message (received via the modem), a timer signal, or infrared motion detection. If the system is in a state where the vehicle is off and the plate operates under limited power 606 and an event occurs where a wakeup task is completed 616, then the system transitions to a state where the vehicle is off, and the plate is in a low-power sleep mode 608. If the system is in a state where the vehicle is off and the plate operates under limited power 606 and an event occurs where the vehicle turns on 612, then the system transitions into the state where the vehicle is on and the plate is on 602.

Some embodiments of display system 100 may include modules, or system components, such as a CPU module configured to perform data processing operations, a modem configured to implement communication protocols, a screen associated with digital display 110, a front light system used to illuminate a screen comprised of a bistatic display or a backlight system used to illuminate a screen comprised of an LCD display or some combination of these, a GPS module for positioning, and an On-Board Diagnostics, version II (OBD-II) connection. Each of these modules consumes power, and is affected by system transitions from one state to another.

Figure 6B:
FIG. 6B presents a table showing how power states affect system components.

FIG. 6B presents a table 601 showing how power states affect system components. As seen in FIG. 6B, when the system is in state 602, the CPU is on, the modem is connected, information on the screen is changeable, the front light is on (to illuminate the screen), the GPS module is on, and the OBD-II connection is on. When the system is in state 604, the CPU is off, the modem is off, the information on the screen is frozen on the last image (this information persists since the display is bistable—for example, an electrophoretic display), the front light is off, the GPS module is off, and the OBD-II connection is off. When the system is in state 606, the CPU is on, but operating in a low power mode, the modem is connected, the information on the screen is changeable, the front light is on, the GPS module is off, and the OBD-II connection is off. When the system is in state 608, the CPU is in a suspended mode or low power mode, the modem is in a low power mode, listening, for example, for an SMS wake signal, the information on the screen is frozen on the last image, the front light is off, the GPS module is off, and the OBD-II connection is off.

Figure 7:
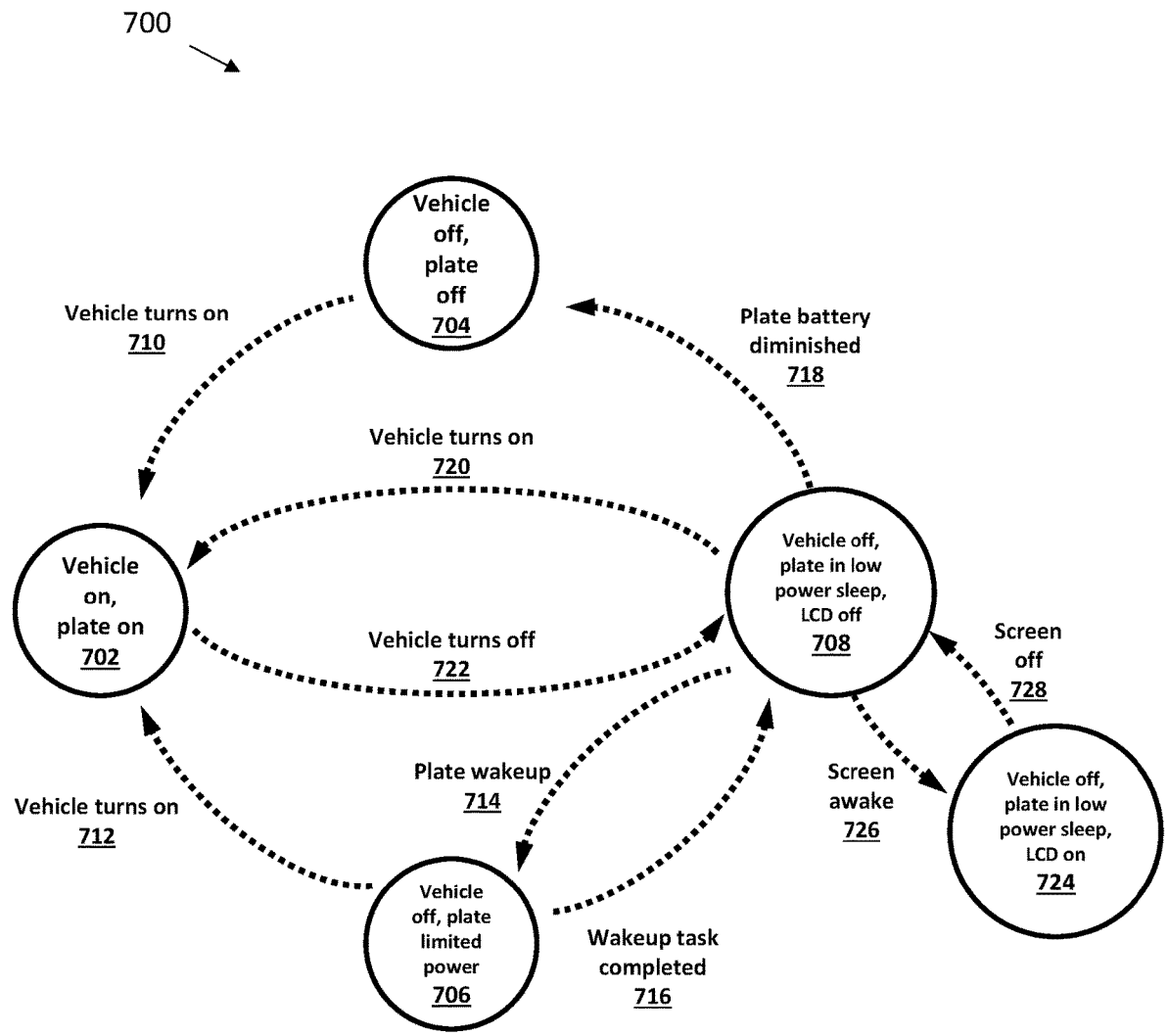
FIG. 7 is a power state diagram.

FIG. 7 is a power state diagram 700 for an LCD display. In FIG. 7, the term "plate" is used synonymously to refer to display system 100. Starting at a state where the vehicle is off and the vehicle power is off 704, if an event where the vehicle turns on 710 occurs, then the system switches to a state where the vehicle is on and the plate is on 702. If, in the state where the vehicle is on and the plate is on 702, an event occurs where the vehicle turns off 722, then the system transitions to a state where the vehicle is off, and the plate is in a low-power sleep mode 708, and the LCD is off. In the state where the vehicle is off, the plate is in a low-power sleep mode and the LCD is off 708, no information is displayed on the LCD, and the LCD may appear dark. If the system is in a state where the vehicle is off, the plate is in a low-power sleep mode and the LCD is off 708 and the vehicle turns on 720, then the system transitions back to the state where the vehicle is on and the plate is on 702. If the system is in a state where the vehicle is off, the plate is in a low-power sleep mode and the LCD is off 708 and an event occurs where the plate battery power is diminished 718, then the system transitions to the state where the vehicle is off and the vehicle power is off 704. If the system is in a state where the vehicle is off, the plate is in a low-power sleep mode and the LCD is off 708 and an event occurs where a plate wakeup signal is received 714, then the system transitions into a state where the vehicle is off and the plate operates under limited power 706. Wakeup signals are triggered by any combination of sensed capacitive touch, an accelerometer event (motion sensed), a cable disconnect (vehicle power disconnected), incoming SMS message (received via the modem), a timer signal, or infrared motion detection. If the system is in a state where the vehicle is off and the plate operates under limited power 706 and an event occurs where a wakeup task is completed 716, then the system transitions to a state where the vehicle is off, the plate is in a low-power sleep mode and the LCD is off 708. If the system is in a state where the vehicle is off, the plate is in a low-power sleep mode and the LCD is off 708 and the system receives a screen awake command 726, the system transitions to a state where the vehicle is off, the plate is in a low-power sleep mode and the LCD is on 724. When the system is in a state where the vehicle is off, the plate is in a low-power sleep mode and the LCD is on 724, information may be displayed on the LCD. If the system is in a state where the vehicle is off, the plate is in a low-power sleep mode and the LCD is on 724 and the system receives a screen off command 728, then the system transitions to a state where the vehicle is off, the plate is in a low-power sleep mode and the LCD is off 708. If the system is in a state where the vehicle is off and the plate operates under limited power 706 and an event occurs where the vehicle turns on 712, then the system transitions into the state where the vehicle is on and the plate is on 702.

Figure 8:
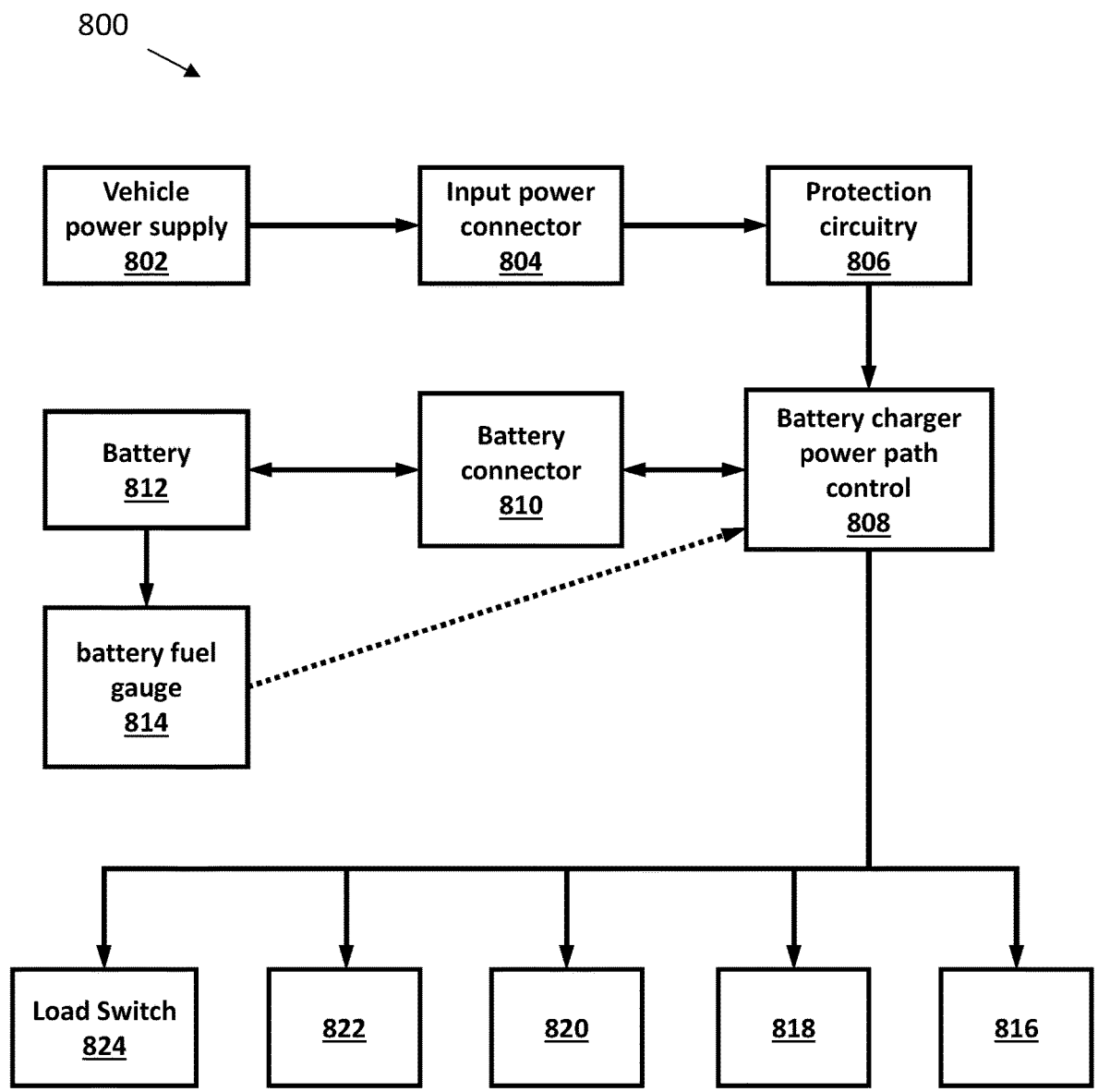
FIG. 8 illustrates an embodiment of a power distribution system.

FIG. 8 is illustrates an embodiment 800 of a power distribution system. In some embodiments, a vehicle power supply module 802 is electrically coupled, via an input power connector 804, to a protection circuitry module 806. Input power connector 804 is a physical connector that allows vehicle power supply module 802 to be appropriately electrically coupled to protection circuitry module 806. Protection circuitry module 806 comprises electrical circuitry configured to prevent undesirable occurrences of electrical phenomena such as overvoltage, reverse voltage, or transients. Protection circuitry module 806 thus prevents overvoltage, reverse voltage or transients from potentially damaging components downstream of the signal chain. Protection circuitry module 806 is electrically coupled to a battery charger power path control module 808. Electrical power from vehicle power supply module 802 is routed to battery charger power path control module 808 via input power connector 804 and protection circuitry module 806.

In some embodiments, a battery 812 is electrically coupled to battery charger power path control module 808 via a battery connector 810. Battery connector 810 is a physical connector that allows battery 812 to be appropriately electrically coupled to battery charger power path control module 808. A battery fuel gauge module 814 is configured to monitor the battery capacity on battery 812.

Battery charger power path control module 808 is configured to route power depending on the state of the system. In some embodiments, when vehicle power supply module 802 is active (for example, when the vehicle is switched on), battery charger power path control module 808 routes electrical power from vehicle power supply module 802 to downstream components. Simultaneously, if the battery capacity associated with battery 812 is less than a predetermined threshold as indicated by battery fuel gauge module 814, a portion of the electrical power from vehicle power supply module 802 may be routed, via battery connector 810, to charge battery 812. On the other hand, when vehicle power supply module 802 is unable to supply electrical power to the system, battery charger power path control module 808 draws power from battery 812 via battery connector 810 to power downstream components, while ensuring that no power from battery 812 is fed back in the direction of vehicle power supply module 802.

In some embodiments, the electrical power output by battery charger power path control module 808 may be distributed to power supporting various voltages, for example, a power generation module 816, a power generation module 818, a power generation module 820, a power generation module 822, and a load switch 824. Power generation module 816 may be, for example, a boost/buck converter, and may be used to power the modem, which may be a cellular modem. Power generation module 818 may be, for example, a boost/buck converter, and may be used to power one or more regulators, where the output of the converter may be used to power the CPU, associated peripherals, and any debug interfaces. The output of the converter may also be used to power certain components of digital display 110. In some embodiments, multiple power generation modules may be implemented, with each power generation module being dedicated to a specific low-dropout regulator (LDO) which, in turn may be dedicated to supplying power to a specific portion of the electrical power. 12V power generation module 820 may a boost/buck converter, and be used to power digital display 110. Power generation module 822 may be, for example, an LDO, the output of which may be used to supply power to certain portions of the electrical circuitry. Load switch module 824 may be used to generate electrical power to supply power to, for example, an ultrasonic transmitter which may be used, for example, for determining relative velocities of objects in the neighborhood of the vehicle.

Figure 9:
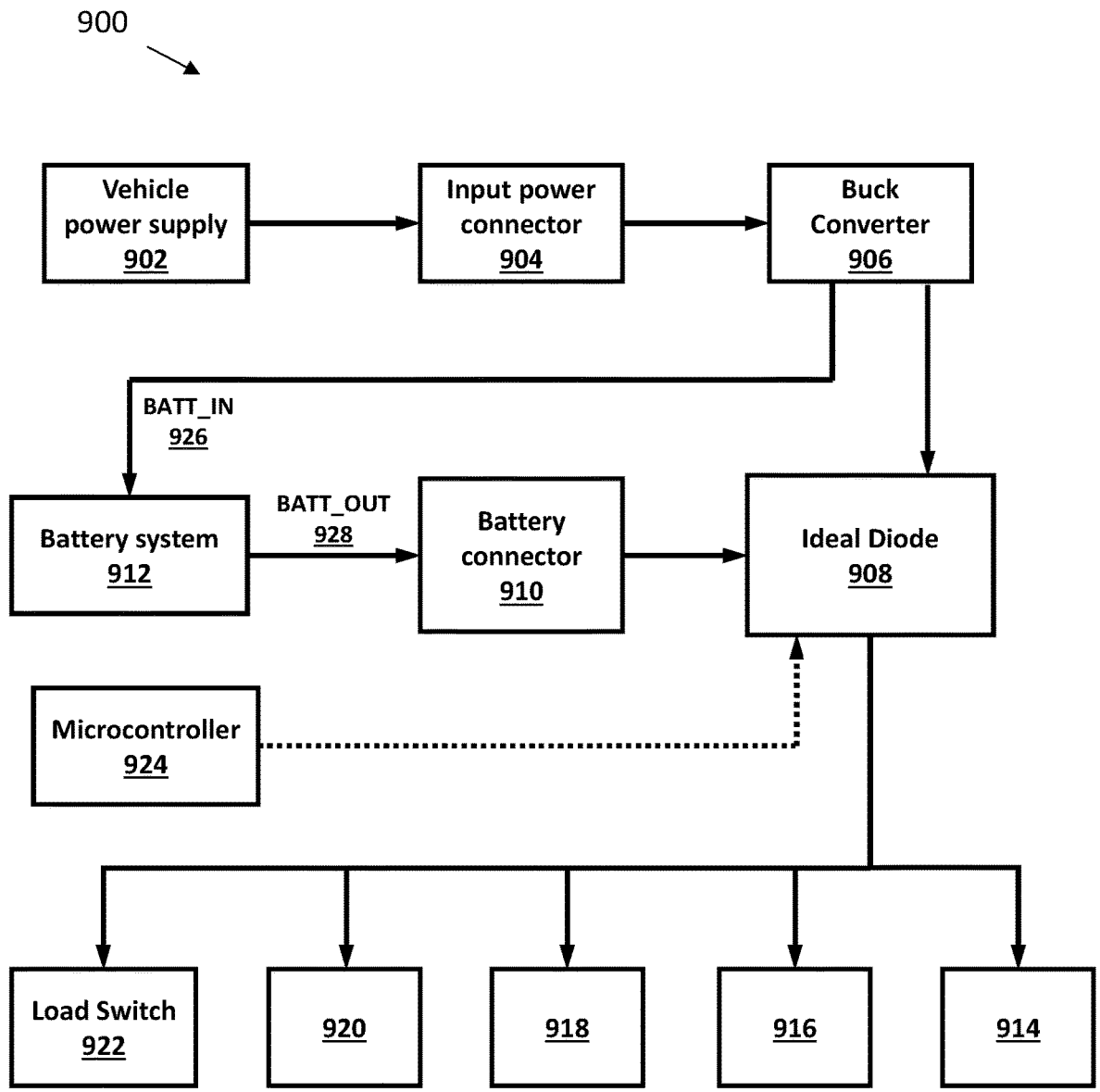
FIG. 9 illustrates an embodiment of a power distribution system.

FIG. 9 illustrates an embodiment 900 of a power distribution system. In some embodiments, a vehicle power supply 902 is electrically coupled to a buck converter 906 via an input power connector 904. Input power connector 904 is a physical connector that allows vehicle power supply 902 to be appropriately electrically coupled to buck converter 906. Buck converter 906 is configured as a DC-to-DC converter that may be configured to step down voltage while stepping up current from a source to a load. Buck converter 906 provides multiple output signals. The first signal can be a BATT_IN signal 926, which is provided to a battery system 912, discussed in detail subsequently. Battery system 912 is configured to generate a BATT_OUT 928 signal which is fed to an ideal diode 908, via a battery connector 910. Battery connector 910 is a physical connector that allows battery system 912, and potentially other signals, to be appropriately electrically coupled to ideal diode 908. Buck converter also generates a second output signal that is fed to ideal diode 908. Ideal diode 908 is configured to produce an output only for positive values of input voltage, and zero output for negative values of input voltage, thus mimicking the ideal theoretical characteristics of a diode. A microcontroller 924 is configured to provide ideal diode 908 an input signal that allows the output of ideal diode 908 to switch between the signal provided by vehicle power supply 902 and battery system 912.

In some embodiments, when vehicle power supply module 902 is active (for example, when the vehicle is switched on), microcontroller 924 configures ideal diode 908 to route electrical power from vehicle power supply module 902 to downstream components. Simultaneously, if the battery capacity associated with battery system 912 is less than a predetermined threshold as indicated by the subsystems of battery system 912 (discussed subsequently), a portion of the electrical power from vehicle power supply module 902 may be routed, via BATT_IN signal 926, to charge batteries associated with battery system 912. On the other hand, when vehicle power supply module 902 is unable to supply electrical power to the system, microcontroller 924 configures ideal diode 908 to draw power from battery system 912 via battery connector 910 to power downstream components, while ensuring that no power from battery system 912 is fed back in the direction of vehicle power supply module 902.

In some embodiments, the electrical power output by ideal diode 908 may be distributed to power, for example, a 3.8V power generation module 914, a 3.3V power generation module 916, a 12V power generation module 918, a 1.8V power generation module 920, and a load switch 922. 3.8V power generation module 914 may be, for example, a boost/buck converter, and may be used to power the modem, which may be a cellular modem. 3.3V power generation module 916 may be, for example, a boost/buck converter, and may be used to power one or more 1.8V regulators, where the 1.8V output of the LDO may be used to power the CPU, associated peripherals, and any debug interfaces. The 1.8V output of the LDO may also be used to power certain components of digital display 110. In some embodiments, multiple 3.3V power generation modules may be implemented, with each 3.3V power generation module being dedicated to a specific LDO which, in turn may be dedicated to supplying power to a specific portion of the electrical system. 12V power generation module 918 may a boost/buck converter, and be used to power digital display 110. 1.8V power generation module 920 may be, for example, an LDO, the output of which may be used to supply power to certain portions of the electrical circuitry. Load switch module 922 may be used to generate electrical power to supply power to, for example, an ultrasonic transmitter which may be used, for example, for determining relative velocities of objects in the neighborhood of the vehicle.

Figure 10:
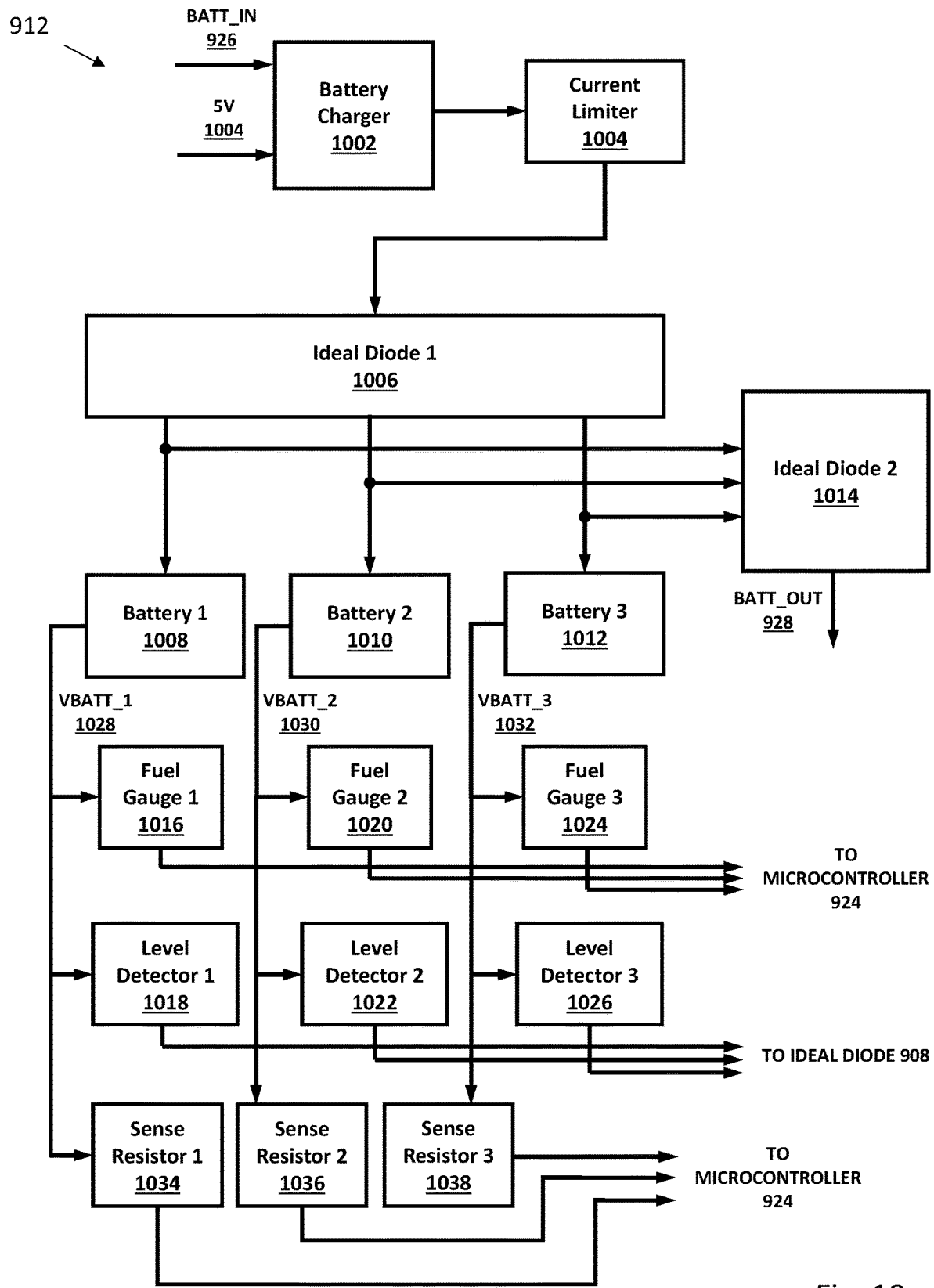
FIG. 10 illustrates an embodiment of a battery system.

FIG. 10 illustrates an embodiment of battery system 912. In some embodiments, battery system 912 includes a battery charger 1002 that is configured to receive the BATT_IN 926 signal. Battery charger 1002 is configured to charge one or more batteries. Battery charger 1002 also receives a 5V signal that may be used to power certain components or subsystems of battery charger 1002. The output of battery charger 1002 is routed to a current limiter 1004, where current limiter 1004 serves to protect downstream circuit components from electric current that exceeds a certain threshold value.

In some embodiments, the output of current limiter 1004 is input to an ideal diode 1 1006. Ideal diode 1 1006 is individually electrically coupled to multiple batteries—in this example a battery 1 1008, a battery 2 1010, and a battery 3 1012. In some embodiments, battery 1 1008, battery 2 1010, and battery 3 1012 may each individually be associated with an individual ideal diode. In other words, ideal diode 1 1006 may be replaced by three individual ideal diodes, each uniquely associated with an individual battery. In other embodiments, battery 1 1008 may be a battery with a rating of 9.6 V nominal, 1.1 Ah, while battery 2 and battery 3 may each be a battery with a rating of 9.6V nominal, 10 Ah. As seen in FIG. 10, each individual electrical connection from ideal diode 1 1006 to battery 1 1008—battery 3 1010 is also electrically coupled to an ideal diode 2 1014. When ideal diode 1 1006 is switched off, the outputs of battery 1 1008, battery 2 1010, and battery 3 1012 are routed through ideal diode 2 1014, and any one individual battery output or a combination of battery outputs may be made available at the output of ideal diode 2 as the signal BATT_OUT 928.

In other embodiments, battery 1 1008, battery 2 1010, and battery 3 1020 each produces an output voltage—VBATT_1 1028, VBATT_2 1030, and VBATT_3 1032 respectively. VBATT_1 1028 is routed to a fuel gauge 1 1016, a level detector 1 1018, and a sense resistor 1 1028, where fuel gauge 1 1016 is configured to determine the charge remaining on battery 1 1008, level detector 1 1018 is configured to determine the voltage level of battery 1 1008, and sense resistor 1 1034 is configured to ensure that the battery is not charged or discharged at improper rates. Similarly, VBATT_2 1030 is routed to a fuel gauge 2 1020, a level detector 2 1022, and a sense resistor 2 1030, where fuel gauge 2 1020 is configured to determine the charge remaining on battery 2 1010, level detector 2 1022 is configured to determine the voltage level of battery 1 1008, and sense resistor 2 1036 is configured to ensure that the battery is not charged or discharged at improper rates. and VBATT_3 1028 is routed to a fuel gauge 3 1024, a level detector 3 1026, and a sense resistor 3 1038, where fuel gauge 3 1024 is configured to determine the charge remaining on battery 3 1012, level detector 3 1026 is configured to determine the voltage level of battery 3 1012, and sense resistor 3 1038 is configured to ensure the battery is not charged or discharged at improper rates.

In other embodiments, the individual outputs of fuel gauge 1 1016, fuel gauge 2 1018, and fuel gauge 3 1020 are electrically coupled to microcontroller 924 via a suitable interface such as the inter-integrated circuit (I²C) communication protocol. Also, the individual outputs of level detector 1 1018, level detector 2 1022, and level detector 3 1026 may be electrically coupled to ideal diode 908, while the individual outputs of sense resistor 1 1036, sense resistor 2 1038, and sense resistor 3 may be electrically coupled to microcontroller 924.

Figure 11:
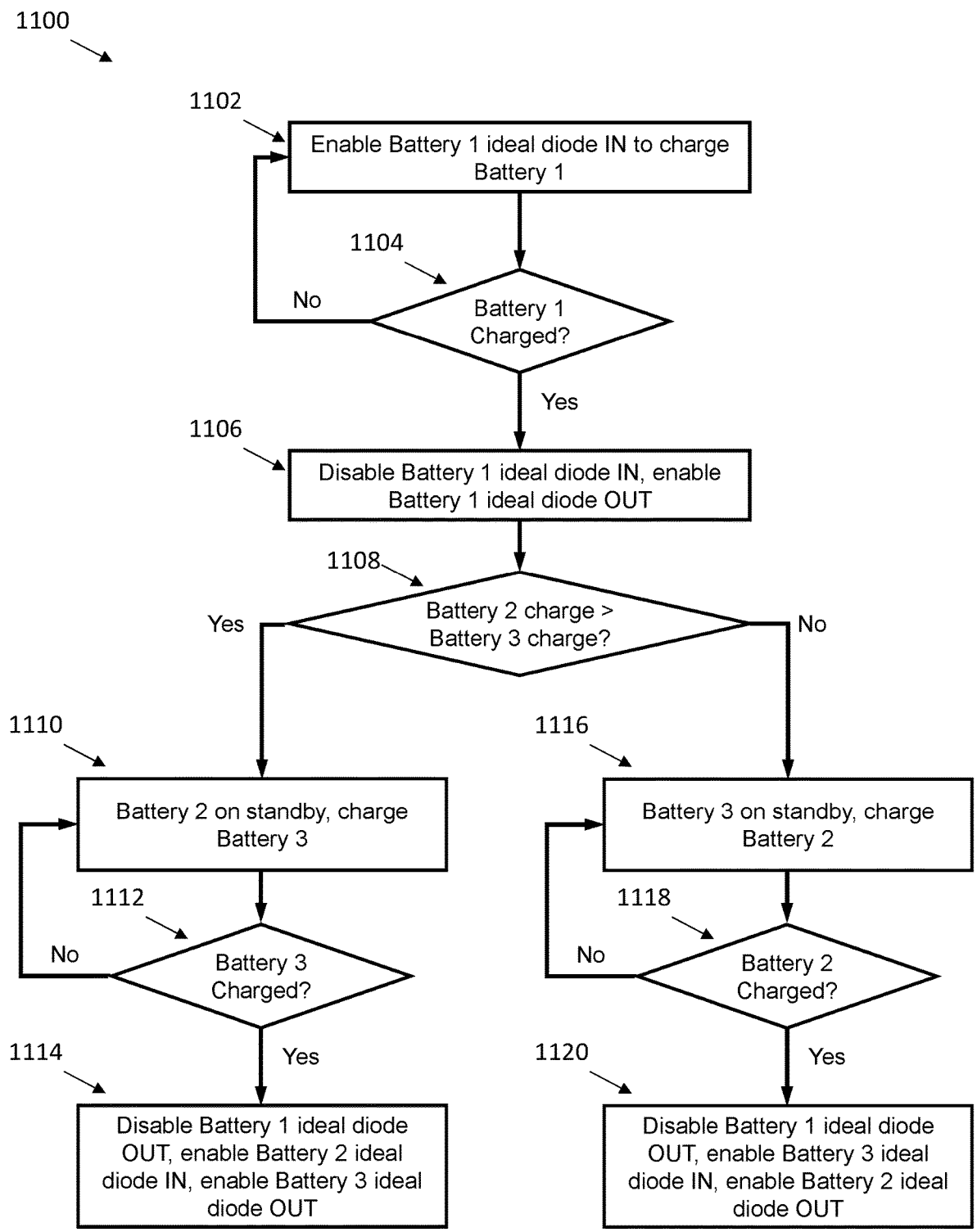
FIG. 11 is a flow diagram illustrating a battery charging method.

FIG. 11 is a flow diagram illustrating one example of a battery charging method 1100. In some embodiments, battery charging method 1100 is associated with charging battery 1 1008, battery 2 1010, and battery 3 1012. As will be appreciated, the particular number of the battery is not critical to practice of the method, and, for example, battery 3 could be checked and charged before battery 1 and 2. At 1102, the method enables the channel of an ideal diode, associated with a battery 1, where the channel is referred to as ideal diode IN, to charge battery 1. At 1104, the method checks to see whether battery 1 is fully charged. If battery 1 is not fully charged, the method returns to 1102. If battery 1 is fully charged, the method goes to 1106, where the channel ideal diode IN associated with battery 1 is disabled, and a channel ideal diode OUT is enabled, where the channel ideal diode OUT allows battery 1 to supply power to any associated circuitry.

At 1108, the method checks to see if the charge on a battery 2 is greater than the charge on a battery 3. If the charge on battery 2 is greater than the charge on battery 3, then the method goes to 1110, where battery 2 is put on standby, while battery 3 is charged. At 1112, the method checks to see if battery 3 is charged. If battery 3 is not charged, the method returns to 1110. If, at 1112, the method determines that battery 3 is charged, the method goes to 1114, where the ideal diode OUT associated with battery 1 is disabled, an ideal diode IN channel associated with battery 2 is enabled (allowing battery 2 to be charged), and an ideal diode OUT channel associated with battery 3 is enabled, allowing battery 3 to supply power to any associated circuitry.

At 1108, if the method determines that the charge on battery 3 is greater than the charge on battery 2, then the method goes to 1116, where battery 3 is put on standby, while battery 2 is charged. At 1118, the method checks to see if battery 2 is charged. If battery 2 is not charged, the method returns to 1116. If, at 1118, the method determines that battery 2 is charged, the method goes to 1120, where the ideal diode OUT associated with battery 1 is disabled, an ideal diode IN channel associated with battery 3 is enabled (allowing battery 3 to be charged), and an ideal diode OUT channel associated with battery 2 is enabled, allowing battery 2 to supply power to any associated circuitry.

Figure 12:
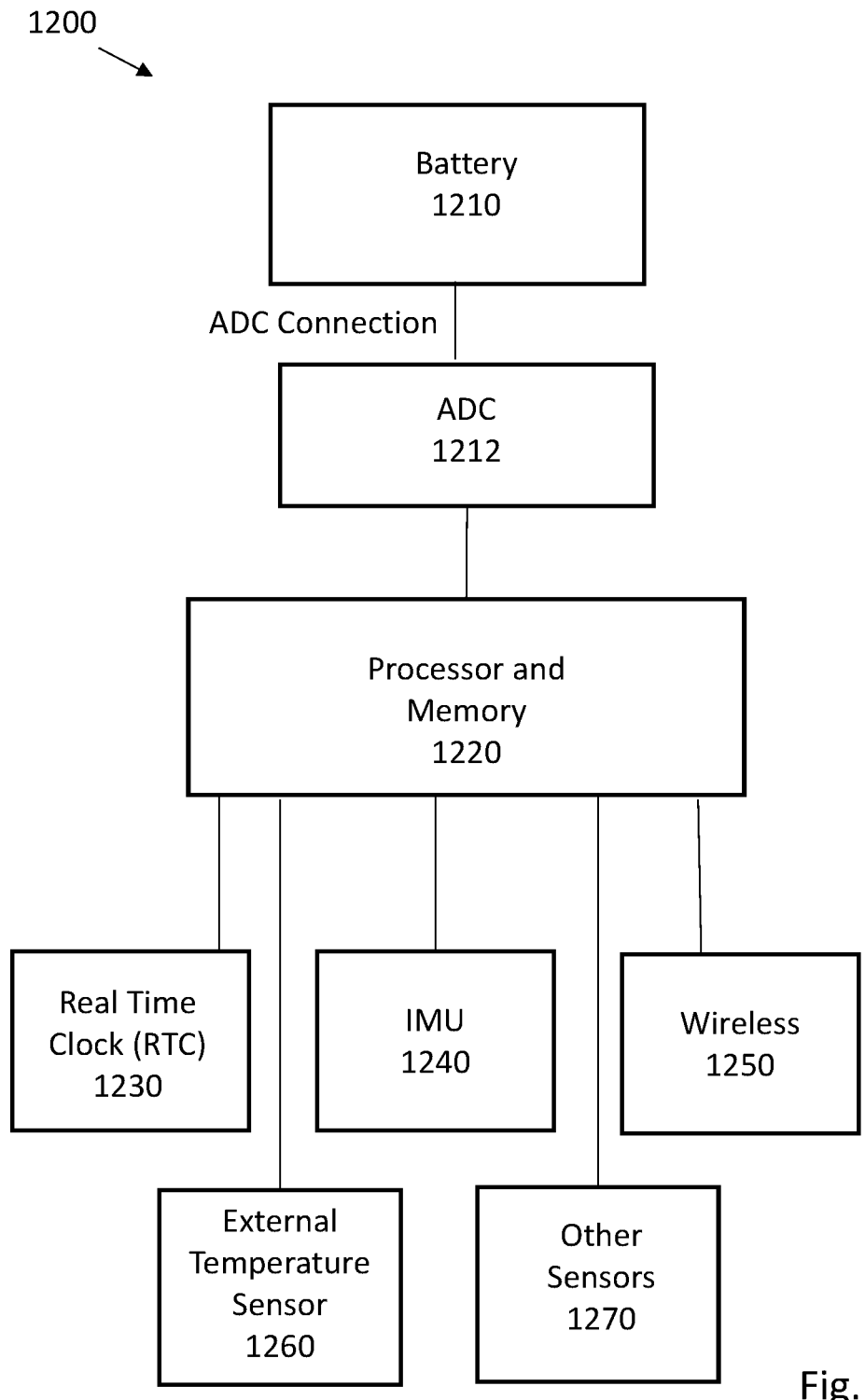
FIG. 12 illustrates a battery health check monitor.

FIG. 12 illustrates a battery health check monitor 1200. A battery 1210 can also be associated with an inertial measurement unit 1040 (IMU) that can include a gyroscope, accelerometer or other motion related sensor able to sense possible impacts. Time of display failure or time of unusual motion related events can be determined using a real time clock 1030. This data can be sent using a wireless module 1050 to a user, server system, or cloud network. Based on received information, replacement digital licenses can be automatically ordered, warranty coverage determined, and failure modes understood.

FIG. 12 illustrates one embodiment of a battery health check procedure that beneficially determines battery health only during actual time of device operation. As compared to devices that continuously or frequently monitor battery activity, a battery health monitor that can use a few simple inputs such as battery voltage, time, and battery or external temperature can be a useful low power subsystem for a digital license plate.

In one embodiment, a battery 1210 can be connected to an analog to digital converter 1212 (ADC) via an ADC connection pin. Measured results from the ADC 1212 can be provided to a processor and memory 1220 for further processing. This processing can include or be responsive to sensor data from a real time clock 1230 (RTC), and inertial measurement unit 1240 (IMU). The IMU 1240 can include accelerometers, gyroscopes, or other instrumentation to measure strength, direction, and type of vehicle movement. In addition, a wireless connectivity system 1250, external temperature sensor 1260, or other suitable sensors 1270 such as pressure or activity sensors can also be connected.

During a digital license plate operational event triggered by sensor data, unloaded battery voltage is read by determined by ADC 1212 and processed and stored in processor and memory 1220. In some embodiments, battery lifetime can be better estimated in conjunction with temperature data from external temperature sensor 1260. The temperature sensor 1260 can be mounted within, on, or near the battery, alternatively located elsewhere on the digital license plate, or can be provide by non-attached local wireless temperature sensors. The temperature data is read, stored/logged, and used with a voltage and temperature lookup table to determine battery health and life estimates based on variations in voltage sag over time and temperature. The battery health or lifetime data can be stored for later readout, or immediately communicated to a local smartphone device or uploaded to a server cloud through the wireless system 1250. Based on received information, replacement digital license batteries or units can be automatically ordered, warranty coverage determined, and failure modes understood. Depending on desired operational state, the digital license plate can be allowed to re-enter a low power state.

Figure 13:
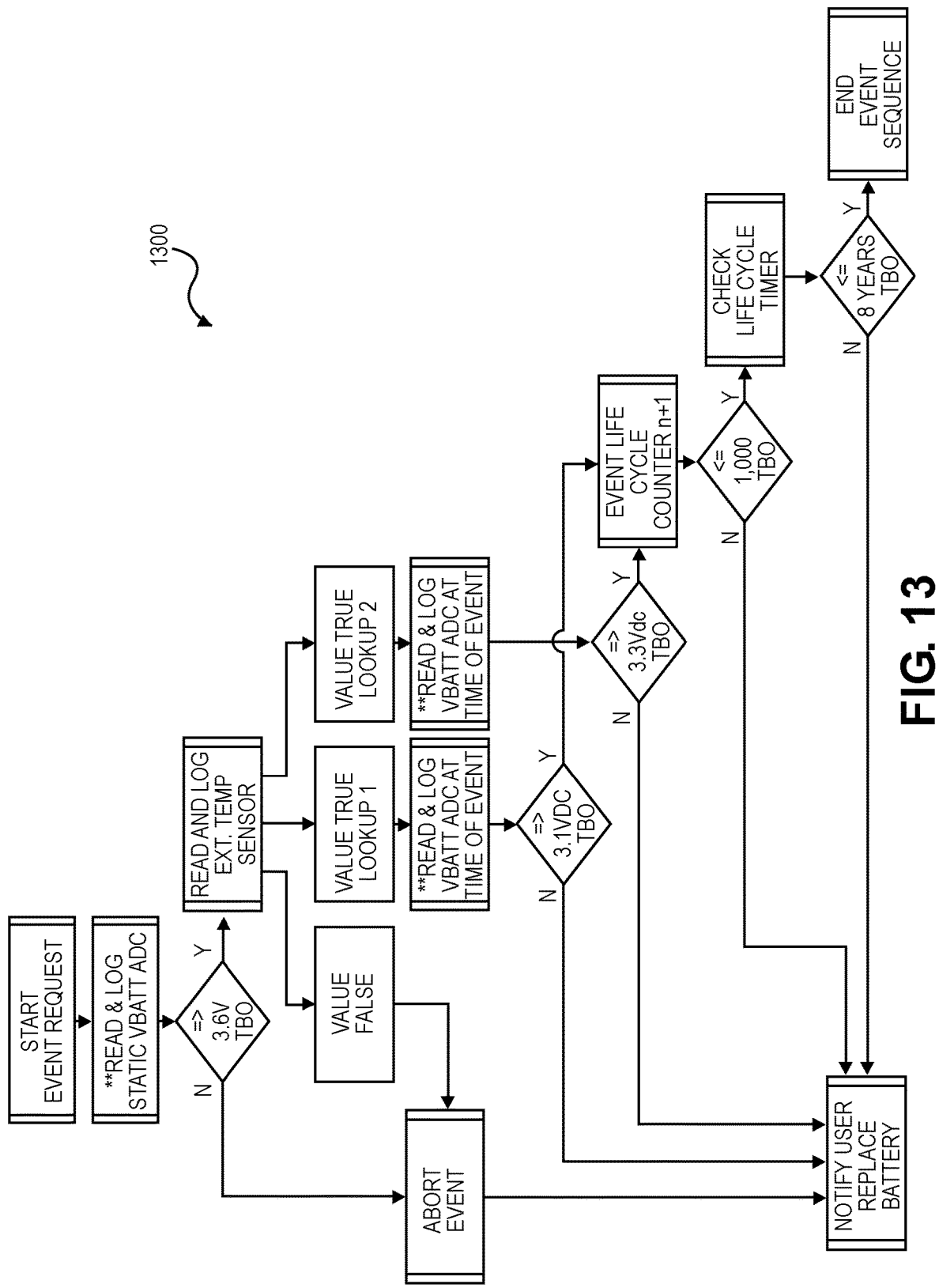
FIG. 13 illustrates one embodiment of a battery health check procedure.

FIG. 13 illustrates an example process flow for operation of a battery health system such as described with respect to FIG. 12. After receiving a start event from activation of a digital license plate, a VBATT ADC connection to a battery is read, stored and logged in memory, and provided for further processing. A temperature reading is also made and stored. If the voltage is higher than a determined threshold operating voltage (in this case 3.6 Volts) a processor performs one of multiple voltage value lookups for temperature and voltage to help determine battery health. If the temperature is too high or too low, a false value determination is made to prevent providing a misleading battery health determination. If the temperature is within an acceptable range, a battery measurement event life cycle counter is incremented, the result checked against a battery lifetime timer, and the data read out or stored for later access. If the lifetime is coming to an end, a notification to a user or digital license plate provider can be made.

Additionally, in some embodiments, the battery life information can be used to initiate or prevent use of digital license plate operation states including an off state, a sleep state, a wake state, and a semi-wake state. In some embodiments, battery lifetime determination is only being made in a wake state. In other embodiments, for example, the battery lifetime determination can be made in a semi-wake state, without requiring full power for all electronic subsystems. Switches between operation states can be triggered in response to detected vehicle voltage, vehicle motion, wireless connection status, location or location changes, or real time clock (RTC) information. Allowed operational states, frequency of operational states, which electronic subsystems can be activated or deactivated can be determined at least in part by determined battery lifetime. In some embodiments battery lifetime determinations are provided to a remote device over a wireless connection.

In the foregoing description, reference is made to the accompanying drawings that form a part thereof, and in which is shown by way of illustration specific exemplary embodiments in which the disclosure may be practiced. These embodiments are described in sufficient detail to enable those skilled in the art to practice the concepts disclosed herein, and it is to be understood that modifications to the various disclosed embodiments may be made, and other embodiments may be utilized, without departing from the scope of the present disclosure. The foregoing detailed description is, therefore, not to be taken in a limiting sense.

Reference throughout this specification to "one embodiment," "an embodiment," "one example," or "an example" means that a particular feature, structure, or characteristic described in connection with the embodiment or example is included in at least one embodiment of the present disclosure. Thus, appearances of the phrases "in one embodiment," "in an embodiment," "one example," or "an example" in various places throughout this specification are not necessarily all referring to the same embodiment or example. Furthermore, the particular features, structures, databases, or characteristics may be combined in any suitable combinations and/or sub-combinations in one or more embodiments or examples. In addition, it should be appreciated that the figures provided herewith are for explanation purposes to persons ordinarily skilled in the art and that the drawings are not necessarily drawn to scale.

Embodiments in accordance with the present disclosure may be embodied as an apparatus, method, or computer program product. Accordingly, the present disclosure may take the form of an entirely hardware-comprised embodiment, an entirely software-comprised embodiment (including firmware, resident software, micro-code, etc.), or an embodiment combining software and hardware aspects that may all generally be referred to herein as a "circuit," "module," or "system." Furthermore, embodiments of the present disclosure may take the form of a computer program product embodied in any tangible medium of expression having computer-usable program code embodied in the medium.

Any combination of one or more computer-usable or computer-readable media may be utilized. For example, a computer-readable medium may include one or more of a portable computer diskette, a hard disk, a random access memory (RAM) device, a read-only memory (ROM) device, an erasable programmable read-only memory (EPROM or Flash memory) device, a portable compact disc read-only memory (CDROM), an optical storage device, and a magnetic storage device. Computer program code for carrying out operations of the present disclosure may be written in any combination of one or more programming languages. Such code may be compiled from source code to computer-readable assembly language or machine code suitable for the device or computer on which the code will be executed.

Embodiments may also be implemented in cloud computing environments. In this description and the following claims, "cloud computing" may be defined as a model for enabling ubiquitous, convenient, on-demand network access to a shared pool of configurable computing resources (e.g., networks, servers, storage, applications, and services) that can be rapidly provisioned via virtualization and released with minimal management effort or service provider interaction and then scaled accordingly. A cloud model can be composed of various characteristics (e.g., on-demand self-service, broad network access, resource pooling, rapid elasticity, and measured service), service models (e.g., Software as a Service ("SaaS"), Platform as a Service ("PaaS"), and Infrastructure as a Service ("IaaS")), and deployment models (e.g., private cloud, community cloud, public cloud, and hybrid cloud).

The flow diagrams and block diagrams in the attached figures illustrate the architecture, functionality, and operation of possible implementations of systems, methods, and computer program products according to various embodiments of the present disclosure. In this regard, each block in the flow diagrams or block diagrams may represent a module, segment, or portion of code, which comprises one or more executable instructions for implementing the specified logical function(s). It will also be noted that each block of the block diagrams and/or flow diagrams, and combinations of blocks in the block diagrams and/or flow diagrams, may be implemented by special purpose hardware-based systems that perform the specified functions or acts, or combinations of special purpose hardware and computer instructions. These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flow diagram and/or block diagram block or blocks. Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

The invention claimed is:

1. A power system comprising:
   a digital license plate having a processor and a plurality of operation states corresponding to different power consumption levels;
   a sensor configured to measure one parameter of a physical environment surrounding the digital license plate;
   storage memory; and
   a battery status monitor operable comprising an analog to digital converter (ADC) connected to a battery to provide status data to the processor in the digital license plate, with status data being stored in the storage memory, and with a determination of battery lifetime being made based at least in part on a variation of the status data over time and the measurements from the sensor, wherein
   the processor switches the digital license plate between the operation states based at least on the determination of the battery's lifetime.

2. The power system of claim 1, wherein operation states include an off state, a sleep state, a wake state, and a semi-wake state, with battery lifetime determination only being made in a wake state.

3. The power system of claim 1, wherein operation states changes are triggered in response to detected vehicle voltage.

4. The power system of claim 1, wherein operation states are triggered in response to vehicle motion.

5. The power system of claim 1, wherein operation states are triggered in response to wireless connection status.

6. The power system of claim 1, wherein operation states are provided to a remote device over a wireless connection.

7. The power system of claim 1, wherein operation states are triggered in response to location or location changes.

8. The power system of claim 1, wherein the sensor is an external temperature sensor.

9. The power system of claim 1, wherein state changes are triggered in response to a real time clock (RTC).

10. The power system of claim 1, wherein allowed operational states are determined at least in part by determined battery lifetime.

11. The power system of claim 1, wherein frequency of operational states are determined at least in part by determined battery lifetime.

12. The power system of claim 1, wherein activation of electronic subsystems for the digital license plate are determined at least in part by determined battery lifetime.

13. The power system of claim 1, further comprising a battery health lookup table that uses external temperature sensor data and ADC data to determine battery health.

14. A method for measuring battery health in a digital license plate having a processor and a plurality of operation states, comprising the steps of
   configuring the digital license plate to have a plurality of operation states corresponding to different power consumption levels;
   configuring a sensor to measure one parameter of a physical environment surrounding the digital license plate;
   reading battery voltage through the analog-to-digital converter ADC connection to a battery and storing the status data in a storage memory; and
   using the processor to determine health of the battery based at least in part on a variation of the status data over time and the measurements from the sensor; and
   using the processor to switch the digital license plate between the operation states based at least on the determination of the battery's lifetime.

15. The method of claim 14, further comprising the steps of
   providing a temperature sensor; and
   determining battery health using temperature data and read battery voltage.

16. The method of claim 14, further comprising the step of
   providing battery health data to a remote device over a wireless connection.

17. The method of claim 14, further comprising the step of triggering an operational state of the digital license plate using at least one of an inertial measuring unit (IMU), real time clock (RTC), and wireless connection system.

* * * * *